(12) United States Patent
Kato et al.

(10) Patent No.: US 6,897,598 B2
(45) Date of Patent: May 24, 2005

(54) ULTRASONIC MOTOR AND GUIDE APPARATUS HAVING THE SAME AS DRIVING SOURCE OF MOVABLE BODY

(75) Inventors: Koji Kato, Sendai (JP); Koshi Adachi, Sendai (JP); Yusaku Ishimine, Kokubu (JP)

(73) Assignee: Kyocera Corporation, Kyoto (JP)

( * ) Notice: Subject to any disclaimer, the term of this patent is extended or adjusted under 35 U.S.C. 154(b) by 136 days.

(21) Appl. No.: 10/331,110

(22) Filed: Dec. 27, 2002

(65) Prior Publication Data

US 2003/0173869 A1 Sep. 18, 2003

(30) Foreign Application Priority Data

Mar. 15, 2002 (JP) .................................... P2002-073024
Apr. 25, 2002 (JP) .................................... P2002-123841

(51) Int. Cl.[7] ............................................. H01L 41/09
(52) U.S. Cl. .................................. 310/323.02; 310/317
(58) Field of Search ....................... 310/316.01–316.02, 310/317, 323.16–323.17, 323.12, 323.02, 323.04, 328; H01L 41/09, 41/04

(56) References Cited

U.S. PATENT DOCUMENTS

| 5,453,653 | A | * | 9/1995 | Zumeris | ................. | 310/323.16 |
| 5,714,833 | A | * | 2/1998 | Zumeris | .................... | 310/328 |
| 5,777,423 | A | * | 7/1998 | Zumeris | ................. | 310/316.01 |
| 5,872,418 | A | | 2/1999 | Wischnewskiy | | |
| 5,877,579 | A | * | 3/1999 | Zumeris | ................. | 310/323.01 |
| 6,025,065 | A | | 2/2000 | Claussen et al. | | |
| 6,107,725 | A | | 8/2000 | Tamai | | |

FOREIGN PATENT DOCUMENTS

| EP | 0 725 476 A1 | | 8/1996 | | |
| JP | 07-273384 | | 10/1995 | | |
| JP | 2000-308939 | | 7/2000 | | |
| JP | 2001-218485 | * | 10/2001 | ............ | H02N/2/00 |
| WO | WO 01/03282 A1 | | 1/2001 | | |

* cited by examiner

Primary Examiner—Darren Schuberg
Assistant Examiner—Karen B. Addison
(74) Attorney, Agent, or Firm—Hogan & Hartson LLP

(57) ABSTRACT

In a guide apparatus having an ultrasonic motor as a driving source of a stage, it is intended to accurately comprehend a degree of abrasion between a friction member of a frictionally driven ultrasonic motor and a drive transmitting member of the stage. A guide apparatus is constructed by an ultrasonic motor, a stage capable of moving on the basis of a friction driving with the ultrasonic motor, a position detecting means for detecting a position of the stage, a driving control portion for outputting a driving command signal to the ultrasonic motor, a non-contact type measuring means for measuring a position information of a friction member in the ultrasonic motor, a slip distance measuring portion for calculating a slip distance of the friction member in the ultrasonic motor, and a monitoring portion 1 equipped with tangential force measuring portion for calculating a tangential force applied to a driving surface of the drive transmitting member in the stage on the basis of the friction driving with the ultrasonic motor.

16 Claims, 9 Drawing Sheets

ULTRASONIC MOTOR AND GUIDE APPARATUS HAVING THE SAME AS DRIVING SOURCE OF MOVABLE BODY

BACKGROUND OF THE INVENTION

1. Field of the Invention

The present invention relates to a friction member provided in an ultrasonic motor for transmitting a vibration of the ultrasonic motor to a movable body. The present invention relates to a guide apparatus in which a ultrasonic motor drives a movable body linearly or rotationally.

2. Prior Art

It is features of ultrasonic motors as power sources for controlling and driving use that a minimum amplitude by vibration is small in an order of nanometer, allowing for precise positioning with high revolution. The ultrasonic motors can provide a large driving force due to friction drive with a compact size. The ultrasonic motors have been conventionally utilized in rotation control systems including lens zoom mechanism for cameras and vibration alarms for wrist watches. In recent years the ultrasonic motors are applied to linear control systems.

The ultrasonic motors can achieve high positioning accuracy during movement of the movable body so that they are desirable for guide apparatuses in precise machining tools or precise measuring apparatuses, and in pattern exposure apparatuses in semiconductor manufacturing systems or the like.

FIG. 8 shows an example of a conventional guide apparatus using an ultrasonic motor for controlling a linear movement of a movable body. This guide apparatus is provided with a linear guide member 12 such as, for example, a pair of cross roller guides, on a base substrate 11, which member guides a stage 13 as a movable body in a linear direction.

A drive transmitting member 14 is fixed to the stage 13 of the guide apparatus on one side thereof in parallel to the guide members 12, and a linear scale 16a is fixed on another side in parallel to the drive transmitting member 14. A measurement head 56b is provided at a position facing to the linear scale 16a on the base substrate 11, making up a position detecting means 16

An ultrasonic motor 15 is fixed to a position opposing to the drive transmitting member 14 on the base substrate 11, which has a friction member 15a arranged with a contact face in a leading end portion thereof, the contact face being in perpendicular contact with a contact face of the drive transmitting member 14. The stage 13 can be guided by the guide members 12 and 12 so as to move and stop via the drive transmitting member 14 in accordance with an ultrasonic vibration of the friction member 15a.

In this example, a case 15d contains the ultrasonic motor 15 therein, both sides of which are held by some springs 15b, with a spring 15c being interposed between a rear portion of the case 15d and the ultrasonic motor 15. A friction member 15a is pressed against the drive transmitting member 14 of the stage 13 so as to be brought into contact therewith.

The ultrasonic motor 15 is shown in FIGS. 10A and 10B, which is made up of a piezoelectric driving portion 15e for generating an elliptic vibration, with the friction member 15a fixed to, and projected from, the piezoelectric driving portion 15e. The friction member 15a is made of glass or ceramic.

In FIGS. 10A and 10B, the piezoelectric driving portion 15e includes a piezoelectric ceramic plate 15f, four electrode films 15g, 15h, 15i and 15j separated into pieces on one major surface of the ceramic plate 15f on one main surface thereof, and a common electrode film formed on substantially all of another major surface of the ceramic plate 15f, and the electrode film 15g and the electrode film 15i positioned at opposing corners are connected by wire, and the electrode film 15h and the electrode film 15j positioned at opposing corners are connected by wire. The electrode film 15i generates a vertical vibration and a horizontal vibration in the piezoelectric ceramic plate 15f by grounding the common electrode film and applying an electric voltage having 90 degrees different in phase from the electrode film 15j. These two mode vibrations are combined with each other so as to elliptically move the friction member 15a and move the stage contact therewith by a narrow step.

Further, in FIG. 8, the driving control portion 10 executes a feedback control for the stage 13, for example, by executing an arithmetic processing necessary for a PID control and outputting a command signal to the ultrasonic motor 15 in correspondence to a deviation between a position information output from the position detecting means 16 in accordance with the movement of the stage 13, and a reference position information on the basis of a preset movement profile of the stage 13, and outputting a command signal to the ultrasonic motor 15. In conventional, P term, I term and D term corresponding to control parameters for executing the PID arithmetic processing are experimentally determined by trial and error before a driving operation is performed, so that a position deviation and a positioning accuracy during the movement of the stage 13 satisfy standards.

In this case, in the guide apparatus used in the working machine for the precision processing, the precision measuring apparatus or the drawing exposure apparatus in the semiconductor manufacturing process, a small position deviation in a sub micron order and a positioning with high accuracy are required during the movement with high accuracy, and a long life time and a high reliability for a long period of time are desired.

However, since the ultrasonic motor 15 is driven by utilizing a friction, a slip tends to be generated between the friction member 15a of the ultrasonic motor 15 and the drive transmitting member 14 of the stage 13. The generation of slip makes positioning of the stage 13 with high accuracy hard, due to accumulation of the slip. Further, the slip changes a contact state between the friction member and the drive transmitting member, and makes any one of them abnormally wear out.

In view of a material of the friction member 15a, since the friction member 15a of the conventional ultrasonic motor 15 slides in a state of being pressed to the drive transmitting member 14, it is necessary to form from a material which is excellent in an abrasion resistance. In conventional, there are the friction member formed by a glass material such as a silica glass, a soda glass or the like, or a ceramic based sinter such as an alumina based sinter having 99.5% by weight or more alumina content, a zirconia based sinter, a silicon carbide based sinter or the like (see Japanese Patent Publication No. 7-273384)

The friction member 15a of the ultrasonic motor 15 employing the glass material such as the silica glass, the soda glass or the like has a small fracture toughness value, and has a risk that a chip or a fracture is generated when a crack is generated. Accordingly, when moving a heavy stage 13 by the ultrasonic motor 15 provided with the friction member 15a made of the glass, there is a case that the chip or the fracture is generated in the friction member 15a by a stress applied at a time of frictionally driving together with the drive transmitting member 14, and it is necessary to stop the guide apparatus every time when the chip or the fracture is generated.

Further, when driving the ultrasonic motor 15 at a high speed, there is a case that a friction heat generated with respect to the drive transmitting member 14 becomes a high temperature which is higher than a softening point of the glass material forming the friction member 15a, and it is hard to apply to a high speed driving.

On the other hand, the friction member 15a of the ultrasonic motor 15 using the ceramic based sinter made of the alumina, the zirconia or the silicon carbide has an advantage that the friction member is hard to be broken in comparison with the glass member. However, in the silicon carbide based sinter, in accordance with a self-lubricating effect, a friction coefficient with the contact face 14a of the drive transmitting member 14 is small, and a slip is generated by driving the ultrasonic motor 15 at a high velocity, so that it is impossible to move the stage 13 at a high speed.

Since a Vickers hardness of the zirconia based sinter is about 12 GPa which is small in comparison with the other ceramic sintered bodies, the zirconia based sinter tends to wear out for a comparatively short period of time due to the friction driving with the drive transmitting member 14. In addition, when driving the ultrasonic motor 15 at a high velocity, there is a case that a friction heat with the drive transmitting member 14 goes over 100° C. Since the zirconia based sintor is generally brittle against heat, there is a risk that an abrasion make progress in correspondence to deterioration in a mechanical characteristic or the like.

The high-alumina based sinter, for example, containing 99.5% by weight or more alumina content, has a very high hardness, however, the high-alumina based sinter is hard to be sintered and requires a high temperature sintering. A normally used alumina based sinter contains about 1 to 2% by weight of sintering aid such as calcia (including calcium oxide), magnesia, silica or the like. A crack is generated in a boundary layer constituted by the sintering aid mentioned above due to a stress applied at a time of frictionally driving with the drive transmitting member 14, and a berry drop of alumina grains is generated. If the grain drop is generated, there is a problem that a scratch is generated in the drive transmitting member 14 by an edge of a recess portion thereof, and the drop grains are bitten into the drive transmitting member 14 so as to scrape and wear out the friction member 15a and the drive transmitting member 14. Since the contact state is changed if the drop grains are bitten into the drive transmitting member 14, there is a risk that a bad influence is applied to a moving characteristic, a positioning accuracy and the like of the stage 13, and a life time of the apparatus is shortened.

In view of a mechanism of the guide apparatus, there is proposed a guide apparatus in which monitoring a slip between the ultrasonic motor 15 and the stage 13 is reflected in a control. Japanese Unexamined Patent Publication No. 2000-308939 discloses using a preload adjusting portion 21 such as a piezoelectric actuator or the like which is expanded or contracted in accordance with an electric voltage application in place of a spring (55c in FIG. 5) applying a preload to the ultrasonic motor 15, as shown in FIG. 9. There is disclosed that this guide apparatus is provided with a non-contact type measuring means 5 such as a laser displacement measuring machine or the like so as to measure position data including a displacement, a velocity and an acceleration of the friction member 15a during the operation of the ultrasonic motor 15, and a slip distance measuring portion 23 calculates a slip distance between the ultrasonic motor 15 and the stage 13 on the basis of the position data of the friction member output from the non-contact type measuring means 5 and the position data of the stage output from the position detecting means 16. This calculated value is used for driving the preload adjusting portion 21 in correspondence to the slip distance so as to adjust a pressing force of the ultrasonic motor 15 applied to the stage 13.

The conventional guide apparatus can forecast a risk of abrasion increased by following up the slip state between the ultrasonic motor 15 and the stage 13, however, since a degree of abrasion is largely different in the uniform slip distance if the driving speed of the ultrasonic motor 15, the preload or the weight of the stage is different, it is impossible to forecast how much the abrasion is made progress in accordance with the driving condition in the case that only the slip distance is monitored.

In particular, if the driving is frequently continued under such a severe condition as the stage 13 is driven at a high speed or a high acceleration, there is a case that the friction member 15a of the ultrasonic motor 15 or the drive transmitting member 14 of the stage 13 is abnormally worn out. The abnormal abrasion makes the guide apparatus break down and makes the life time of the guide apparatus short beyond expectation, however, it is hard to forecast the life time of the guide apparatus.

Accordingly, in the guide apparatus used for the precise working machine, the precise measuring apparatus and the drawing exposure apparatus in which the high position accuracy of the stage 13 is required in the middle of the driving, a further high reliability is required.

In the conventional guide apparatus, since it is necessary that the non-contact type measuring means is always mounted to the apparatus for measuring the slip distance, there is a problem that the structure of the apparatus is made complicate and large size. Further, there is accordingly a problem in view of a cost.

Accordingly, in order to measure the slip in the precise measuring apparatus and the drawing exposure apparatus in which a small occupied space is required, it becomes hard to design and there is a limitation in design.

SUMMARY OF THE INVENTION

An object of the present invention is to provide an ultrasonic motor in which a mechanical characteristic is not largely deteriorated due to a friction heat, an abrasion resistance is excellent and no slip is generated even when the ultrasonic motor is driven at a high speed.

Another object of the present invention is to provide a guide apparatus which has a compact size, can move a movable body at a high speed, can obtain a stable driving characteristic and has a long life time, by employing the ultrasonic motor as a driving source of the movable body.

Further, the other object of the present invention is to provide an ultrasonic motor which can be also used in a guide apparatus unmatched with a magnetic body.

The another object of the present invention is to provide a guide apparatus which can forecast an abrasion of a friction member in an ultrasonic motor and a drive transmitting member in a stage, caused by a slip between the ultrasonic motor and the stage, by detecting the slip.

Another object of the present invention is further to provide a guide apparatus provided with a control system which can prevent the abrasion from being generated.

Another object of the present invention is further to provide a guide apparatus which can obtain position data required for judging the slip without depending upon the non-contact type measuring device, and can achieve a simple structure of the apparatus.

In the ultrasonic motor in accordance with the present invention, a friction member of the ultrasonic motor is formed by an alumina based sinter containing an alumina as a main component and titanium carbide as a secondary component. The ultrasonic motor is structured such as to frictionally drive a movable body and serve as a driving source for the movable body by arranging the friction member in such a manner as to bring into contact with the movable body and transmitting a vibration of the ultrasonic motor via the friction member.

The guide apparatus in accordance with the present invention is a guide apparatus having an ultrasonic motor as a driving source of a movable body, comprising:

an ultrasonic motor having a friction member;
a movable body capable of moving on the basis of a friction driving of the ultrasonic motor with respect to the friction member;
a position detecting means for measuring a position of the movable body; and
a driving control portion arithmetically processing on the basis of a deviation between a position information output from the position detecting means and a reference position information based on a present movement profile, and outputting a driving command signal for driving the ultrasonic motor,
wherein the guide apparatus includes a monitoring portion provided with a slip distance measuring portion for calculating a slip distance of the friction member in the ultrasonic motor and a tangential force measuring portion for calculating a tangential force applied to a driving surface in a side of the movable body in accordance with the friction driving with the ultrasonic motor. The monitoring portion can include a friction work measuring portion for measuring a friction work from a product of the slip distance calculated by the slip distance measuring portion and the tangential force calculated by the tangential force measuring portion.

It is possible to measure the position information such as a displacement, a velocity, an acceleration and the like of the friction member during the driving of the ultrasonic motor by a non-contact type measuring means.

The guide apparatus in accordance with the present invention includes calculating the position information of the friction information without using the non-contact type measuring means. This guide apparatus is constituted by a replacing portion which replaces the driving command signal during the driving or the ultrasonic motor by a vibration velocity of the friction member on the basis of a specific driving command signal previously measured by moving the movable body by the ultrasonic motor and an information of a vibration velocity on a driving surface of the friction member, and a slip distance measuring portion which calculates a slip distance or a transmission efficiency on the basis of the velocity of the movable body calculated on the basis of the position information obtained from the position detecting means, and the vibration velocity replaced in the replacing portion.

The guide apparatus can include a decision portion which judges whether or not a friction working load obtained by the friction working amount measuring portion is within a threshold value of the preset friction working amount.

The guide apparatus can include a parameter adjusting portion which changes control parameters in the driving control portion on the basis of a result judged by the decision portion so that the friction working load obtained by the friction working load measuring portion falls within a threshold value thereof.

The guide apparatus can include an alarm portion which notifies that an abnormality is generated within the apparatus in the case that the guide apparatus is driven by the driving control portion with using the control parameter changed by the parameter adjusting portion, and the case that the friction working load is more than the preset threshold value.

BRIEF DESCRIPTION OF THE DRAWINGS

The present invention will be described in detail below with reference to the accompanying drawings, in which.

DETAILED DESCRIPTION OF THE PRESENT INVENTION

An ultrasonic motor is constituted by a vibration body and a friction member for transmitting a vibration of the vibration body to a movable body to be moved. The vibration body is formed of a piezoelectric ceramic plate and electrodes secured on major surfaces thereof and the friction member is fixed to a side face of the piezoelectric ceramic plate, protruding from the side face, to transmit the vibration of the piezoelectric ceramic plate to the movable body via the friction member so as to move the movable body.

The structure of an ultrasonic mortar according to the invention can be also applied to ultrasonic motors of a single vibration mode and a multiplex mode of standing wave type and traveling wave type, plural vibration modes of mode conversion type, a compound vibration type and the like. The present invention can be applied to movable bodies, for example, movable stages in the following embodiment, linearly or rotationally move.

Figure 10:
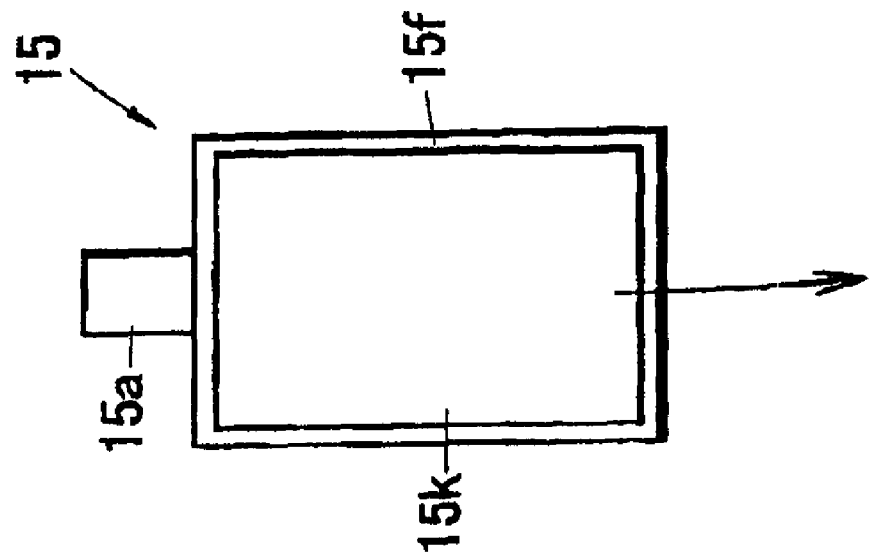
FIG. 10A shows a top view of an ultrasonic motor which has an arrangement of four driving electrodes in a major surface of a piezoelectric plate.
FIG. 10B shows a bottom view of an ultrasonic motor which has a common ground electrode on the other major surface of the piezoelectric plate shown in FIG. 10A.
Figure 10:
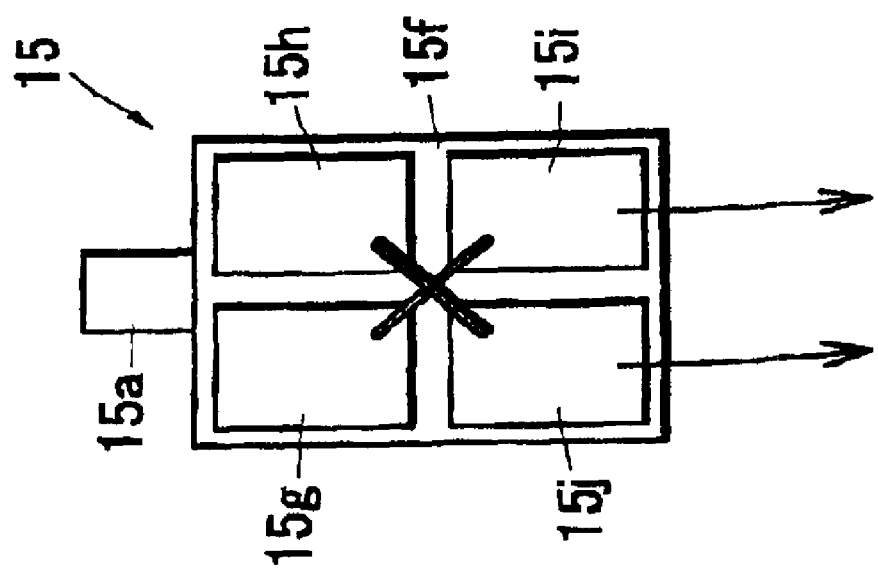

FIGS. 10A and 10B show a structure of an ultrasonic motor which drives a vibration body or a guide apparatus. In this structure, a grounding electrode film 15k is formed in one main surface of a piezoelectric ceramic plate 15f, a pair of electrode films 15g and 15i are formed at opposing corner positions of another main surface while another pair of electrode films 15h and 15j are formed at orthogonal opposing corner positions of another main surface, driving electric voltages having different phases by 90 degrees are applied between the two pairs of electrode films with respect to the grounding electrode 15k so as to generate a longitudinal vibration and a lateral vibration in the piezoelectric ceramic plate 2, and a combination of these vibrations makes the friction member 15a perform an elliptic motion having a major axis in a lateral direction, applying the electric voltage whose phase is reversed can make the friction member vibrate in the reverse elliptic motion in an opposite direction.

Figure 1:
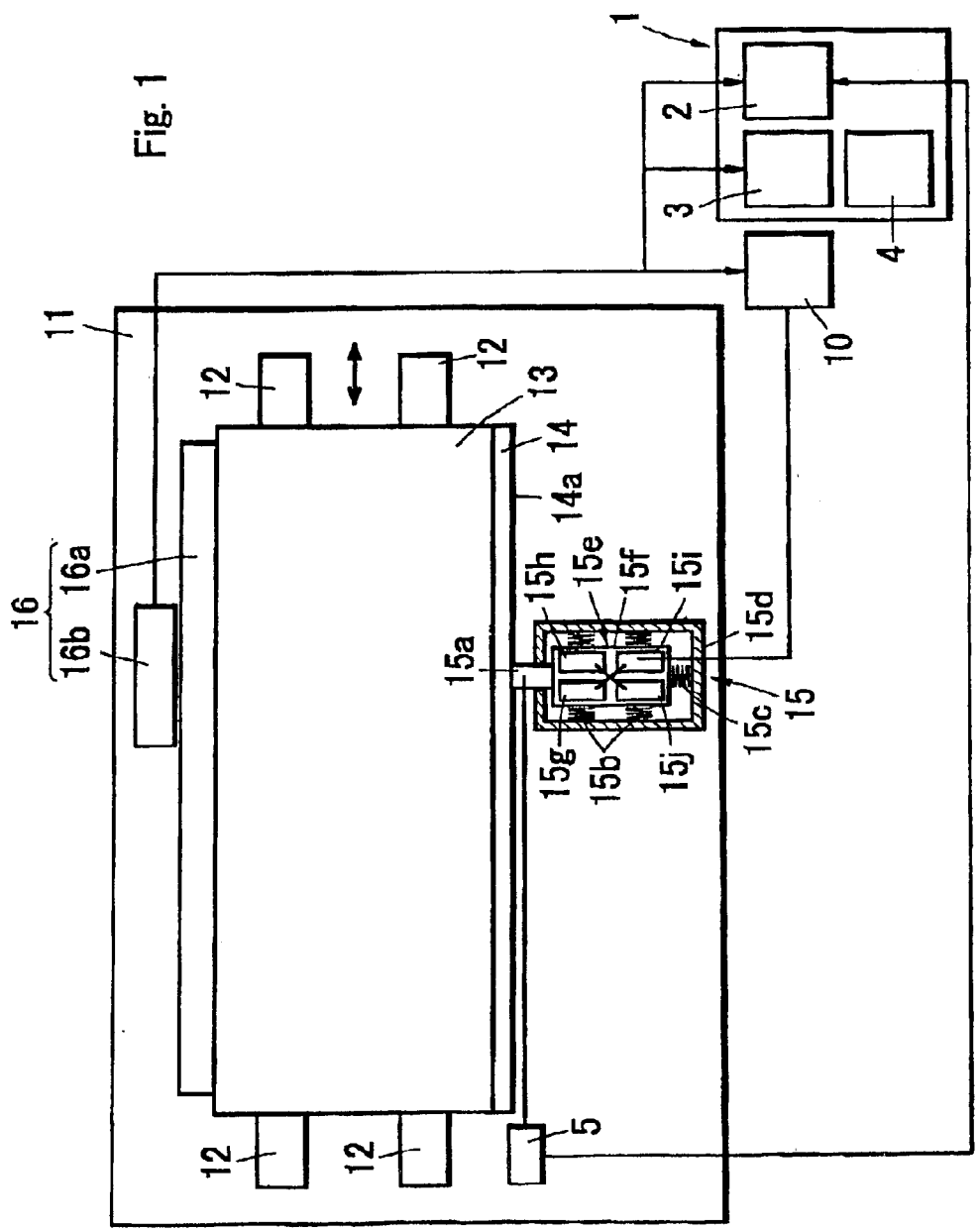
FIG. 1 is a schematic top view of a guide apparatus in accordance with an embodiment of the present invention.
Figure 9:
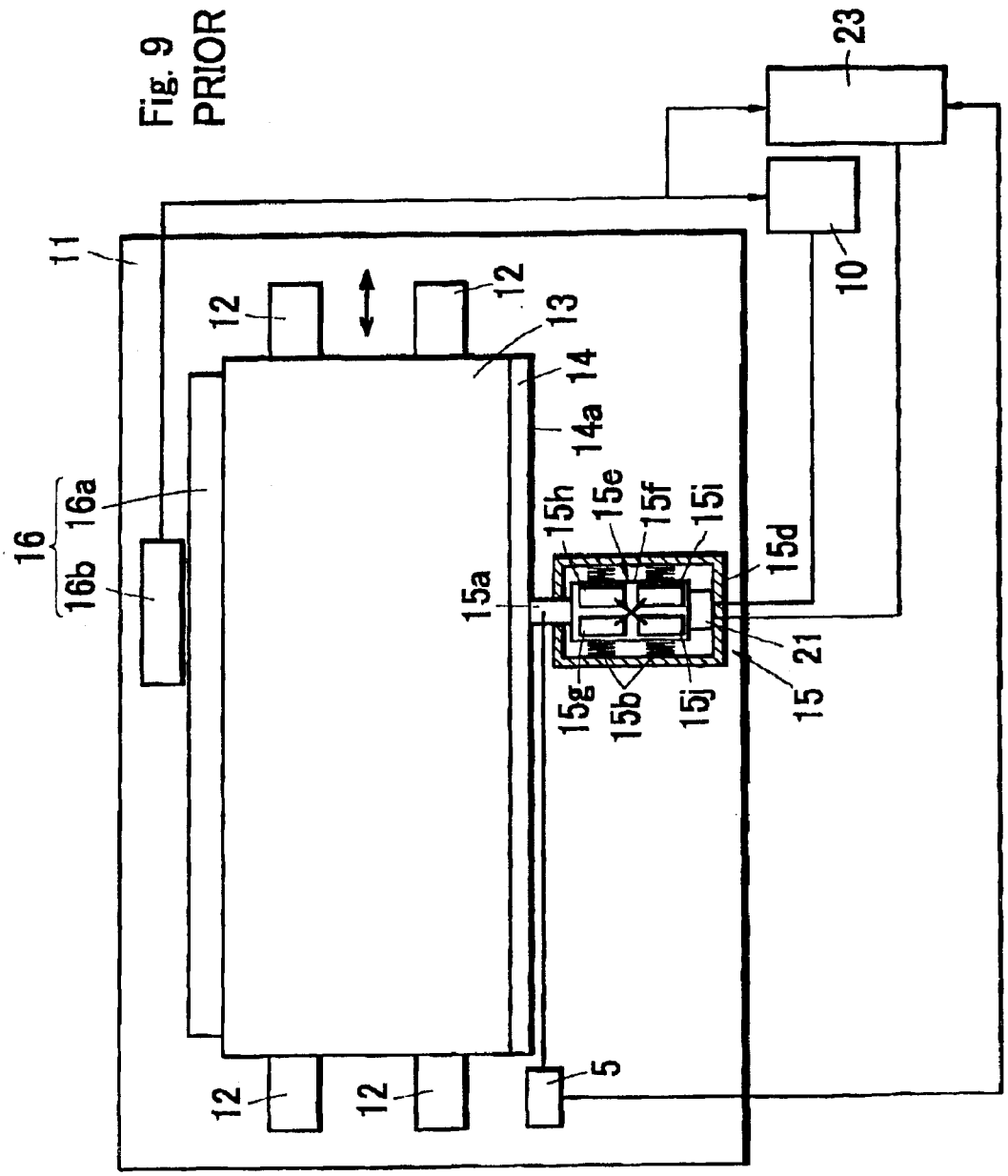
FIG. 9 is a schematic top view showing a conventional guide apparatus.

Such a ultrasonic motor can be combined with a movable body to comprise a guide apparatus. The guide apparatus, for example, as shown in FIGS. 1 and 9, includes a stage 13 movable linearly on a pair of guide members 12 and 12, such as cross roller guides, on a base plate 11, and the motor is used for linearly guiding the stage 13 as a movable body along these guide members. In this case, a drive transmitting member 14 is fixed to one side face of the stage 13 and a friction member 15a of the ultrasonic motor 15 is arranged to be brought into contact with the drive transmitting member 14 perpendicularly with respect to the longitudinal direction of the guide member, then reciprocating back and forth the stage 13 along the guide member which is driven by a sideward elliptic vibration of the friction member 15a.

The ultrasonic motor is held within the case by four springs 15b, and the friction member 15a of the ultrasonic motor 15 is pressed against the drive transmitting member 14 by a spring 15c placed between a rear end of the ultrasonic motor 15 and the inside wall of the case 15d. The ultrasonic motor 15 is provided with a load cell between the spring 15c and the inside wall of the case to measure a pressing force of the ultrasonic motor 15 to the drive transmitting member 14.

Embodiment 1

In the ultrasonic motor 15 in accordance with the present invention, the friction member 15a mentioned above is formed by an alumina based sinter containing alumina as a main component and titanium carbide as a secondary component.

Although alumina has a high hardness (Vickers hardness Hv 18 GPa) and a high melting point (2100° C.), the titanium carbide to be added thereto has a higher hardness (Vickers hardness Hv of 28 GPa) and a higher melting point (3200° C.) than alumina, and a high toughness (fracture toughness; 6 MPam$^{1/2}$). The alumina based sinter containing titanium carbide has characteristics of high friction coefficient, high abrasion resistance and high resistance against separation of grains due to abrasion.

The present invention utilizes alumina containing titanium carbide as the friction member of the ultrasonic motor, which can drive a drive transmitting member fixed to the side face of a stage as movable body. Since the contact face of the friction member is too hard to be worn out with a drop of particles and fracture, it is possible to reduce the abrasion of the drive transmitting member. The friction member and the drive transmitting member can withstand abrasion to always stabilize the contact state for a long time period.

With respect to another advantage of the friction member 15a in the alumina based sinter, when sliding with the drive transmitting member at a high speed, a mechanico-chemical reaction of titanium carbide to oxygen in the atmospheric air due to friction generate a titanium oxide film having a greater friction coefficient than alumina or titanium carbide on the contact face of the friction member. Accordingly, even when driving the ultrasonic motor, it is possible to move the stage 13 at a high speed with hardly producing a slip between the friction member 15a and the drive transmitting member. The above effects are exhibited under reduced lower pressures than air atmosphere with low oxygen concentrations Preferably, the alumina based sinter has a content of titanium carbide between 10 and 50% by weight. The content of titanium carbide less than 10% does not improve the mechanical characteristics such as hardness, strength and roughness of the alumina based sinter, or increase friction resistance, with less effect of preventing a slip at a time of driving the ultrasonic motor at a high speed.

On the other hand, when the content of titanium carbide is more than 50% by weight, the hardness of titanium carbide exposed to high temperatures is reduced, so that the friction driving with respect to the drive transmitting member for a long time period promotes the abrasion of the friction member.

In the alumina based sinter, sintering aid components may be added other than titanium carbide. The sintering aids may preferably be selected from paramagnetic metal oxides for an ultrasonic motor used in applications which would not want magnetization. It is preferable that the paramagnetic metal oxides contain oxides of Mg, Zr, Si and Y. While these metal oxides are paramagnetic, however, an increased amount of these oxides results in alumina based sinters exhibiting magnetism.

The alumina based sinter may contains one or more paramagnetic metal oxides as aid components in a total amount of 0.05 to 7% by weight. The oxide contained in this range can maintain high hardness of the alumina based sinter at Vickers hardness (Hv) 19 GPa or more and a maximum magnetic flux density of the alumina based sinter at 0.05 $\mu$T or less. Lower contents of the paramagnetic metal oxides than 0.1% by weight in total make it impossible to provide a sinter promoting effect necessary for forming a sufficiently densified sinter.

The alumina based sinter may preferably has each of maximum grain sizes of an alumina phase and a titanium carbide phase of 4 $\mu$m or less and a maximum pore size of 2 $\mu$m or less in the alumina based sinter. When the maximum grain size of any of the phases is more than 4 $\mu$m, large recesses are apt to be formed on the contact face of the friction member, causing a drop of particles from the friction member or a fracture thereof, thereby damaging the drive transmitting member. Also, Pores having a maximum size more than 2 $\mu$m in the alumina based sinter are apt to generate a particle drop or fracture due to the friction of the friction member to the drive transmitting member Although the contact face of the friction member 15a drives the drive transmitting member 14 due to the contact therewith, if this surface is very rough, the drive transmitting member 14 has scratches generated by the opposing member in an initial driving process and thereafter are rapidly abraded, as well as the contact face of the friction member violently wears out. Accordingly, it is preferable that the contact face of the abrasion member 15a is set to 0.2 $\mu$m or less in an arithmetic mean roughness (Ra).

The ultrasonic motor of this embodiment is composed of the friction member of the sinter mentioned above fixed to the piezoelectric vibration body and is arranged to be brought into contact with a movable body to which the vibration of the ultrasonic motor is transmitted via the friction member, which makes up a guide apparatus.

The alumina based sinter in this embodiment may be produced by mixing a raw material powder and a binder to form a powder mixture, molding the slurry in a given shape to molded parts followed by a calcining treatment. The mixed powder is prepared by mixing, for example, 50 to 90% by weight of an alumina powder having grain sizes of between 0.3 and 0.6 μm, 10 to 50% by weight of a titanium carbide powder having grain sizes of between 0.3 and 0.6 μm, and totally 0.1 to 7% by weight of paramagnetic oxides of metals such as Mg, Zr, Si, Y and the like as sintering aid, together with a desirable binder. The mixture is formed in a desired shape in accordance with known ceramic forming techniques, such as for example, uniaxial press, isobaric press or injection molding, and is thereafter sintered in a vacuum for about 1 to 2 hours at a temperature of 1600 to 1750° C.

In order to reduce the grain size and pore size, further, by pressurizing under a pressure about 20 to 40 MPa during sintering, the maximum grain sizes of the alumina phase or the titanium carbide phase can be made 4 μm or less and the maximum pore size of the alumina based sinter can be made 2 μm or less.

Then, the resulting alumina based sinter is bonded or adhered to a vibration body for using as the friction member of an ultrasonic motor, and this ultrasonic motor is mounted on the guide apparatus. In friction driving of the drive transmitting member of a stage, the friction member not only reduces in abrasion, but also reduce the scratches in the drive transmitting member which is the opposing member, which also can restrict the abrasion of the drive transmitting member, resulting in the guide apparatus to be driven for a long time period. Since the friction member reduces the interposition of dropped particles between the friction member and the drive transmitting member, it stabilizes the contact state between the friction member and the drive transmitting member, and does not influence the accuracy of stage positioning during movement. Further, since titanium oxide having a high friction efficiency than that of alumina or titanium carbide can be formed on the surface of the friction member made of the alumina based sinter due to friction with the drive transmitting member, no slip is generated even by increasing the driving force of the ultrasonic motor for moving the stage at a high speed.

EXAMPLE 1

Figure 8:
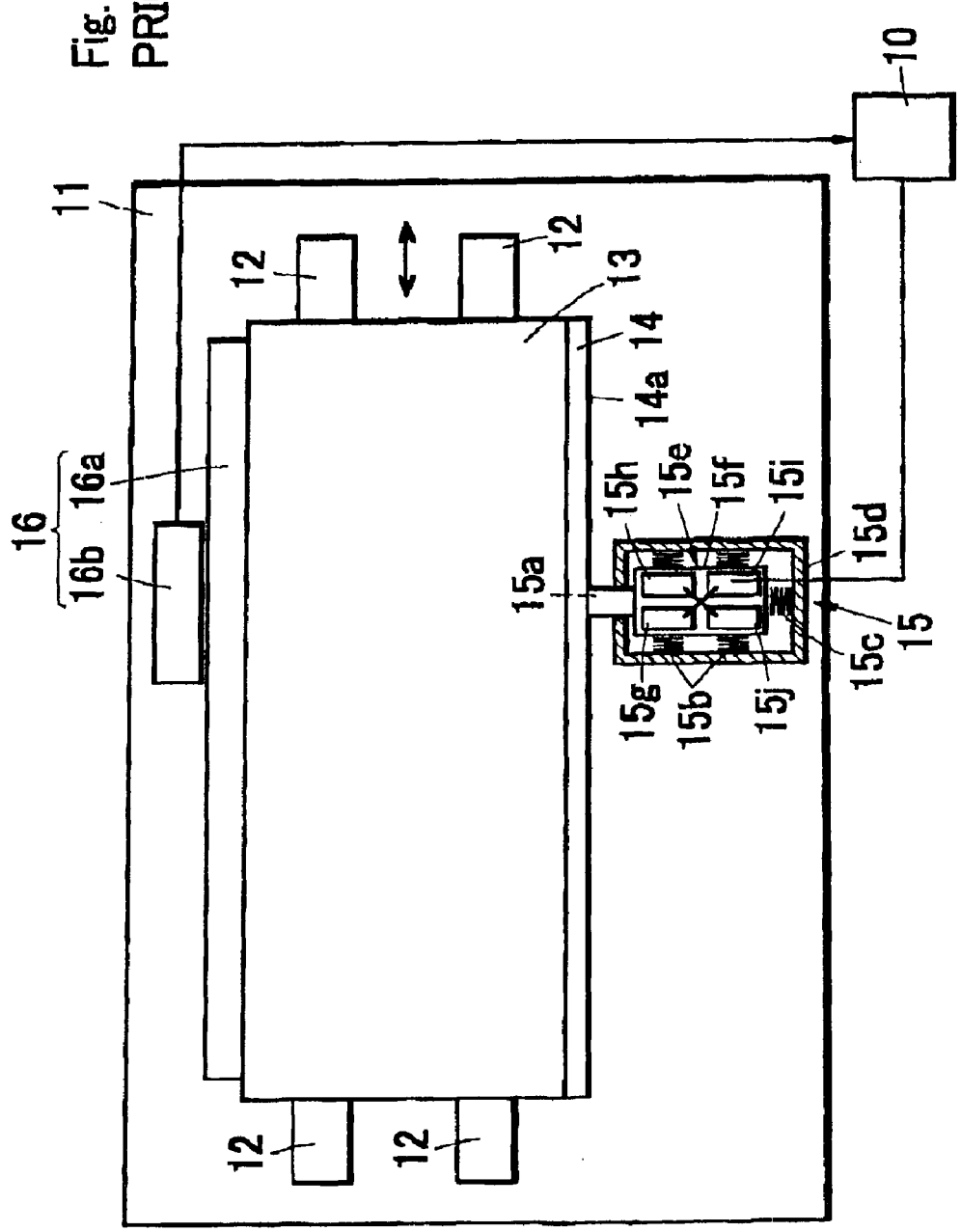
FIG. 8 is a schematic top view showing a conventional guide apparatus.

In this example, friction members for ultrasonic motors were made of alumina based sinters containing titanium carbide in accordance with the present invention, and comparative friction members are also made of silica glass, a high purity alumina based sinter, a zirconia based sinter, and a silicon carbide based sinter. The alumina based sinters containing titanium carbide were prepared by formulating in various contents titanium carbide and aid components as shown in Table 1, and were provided for assembling a conventional type of ultrasonic motors as shown in FIG. 8. Experiments were carried out for determining the abrasion amounts of the friction members and of the drive transmitting members in driving the ultrasonic motors.

In the tests, the friction members were formed as a column having a length of 4.2 mm and a diameter of 3 mm, and a spherical contact face with a curvature radius of 7 mm. The vibration bodies of ultrasonic motors were produced of a piezoelectric ceramic plate which was piezoelectric ceramic of lead zirconate titanate having a length of 30 mm, a width of 7.5 mm and a thickness of 3 mm. The friction member was bonded to the piezoelectric ceramic plate.

A guide apparatus used for the test includes a stage having a weight of 5 kg which is mounted on and guided with a pair of cross roller guides as a guide member with a stroke of 100 mm. The guide apparatus has a drive transmitting member, fixed on a side face of the stage, which is made of an alumina sinter of 99% in purity with Vickers hardness 15.2 GPa. The ultrasonic motor is arranged such that the fiction member is brought into contact with a contact face of the drive transmitting member, the contact face being set to 0.05 μm in arithmetic mean roughness (Ra).

In the tests, the driving profile of the stage which had been previously set in a control portion was set to a trapezoidal vibration wave at a driving frequency of 40 kHz, at a repeating moving distance of 100 mm, and to acceleration and deceleration of 0.03 G at a maximum velocity of 100 mm/s. Further, the abrasion amounts of the friction member and of the drive transmitting member were measured after driving the stage for 500 km under the above conditions.

Further, before starting the tests, samples of friction members were observed by scanning electron microscopy at 2000 magnifications to determine the crystal grains and the maximum pore size in the contact faces of the friction members. Rectangular parallelepiped test pieces having a length 3 mm, a width 3 mm and thickness 1.2 mm is made were cut out of the materials which were used for the friction members to measure maximum magnetic flux densities using an alternating magnetic force meter (a type "2900-04C" manufactured by Tokyo Instruments Co., Ltd.). The results are as shown in Table 1.

It is found from Table 1 that in sample Nos. 5 to 32, formed by alumina based sinters containing titanium carbide, the friction member and corresponding drive transmitting member are significantly prevented from being worn out as compared to the samples Nos. 1 to 4 in which the friction members are formed by silica glass, a high purity alumina based sinter, a zirconia based sinter and a silicon carbide based sinter.

TABLE 1

| | | | | | | | grain size Max. ($\mu$m) | Pore size Max. ($\mu$m) | B ($\mu$T) | wear loss $10^{-2}$ mm$^2$ | Transmit. member wear loss $10^{-2}$ mm$^2$ |
|---|---|---|---|---|---|---|---|---|---|---|---|
| | First component | cont. % | Secondary component | cont % | Sintering agents | | | | | | |
| 1 | Quartz | 100 | — | | — | | 25 | 25 | 0.05 | 179 | 0.30 |
| 2 | Alumina | 99 | | — | MgO | 0.5 | 30 | 25 | 0.05 | 12 | 0.40 |
| | | | | | SiO$_2$ | 0.3 | | | | | |

TABLE 1-continued

| | Friction member | | | | | | | | Transmit. |
|---|---|---|---|---|---|---|---|---|---|
| First component | cont. % | Secondary component | cont % | Sintering agents | | grain size Max. ($\mu$m) | Pore size Max. ($\mu$m) | B ($\mu$T) | wear loss $10^{-2}$ mm$^2$ | member wear loss $10^{-2}$ mm$^2$ |
| | | | | others | 0.2 | | | | | |
| 3 zirconia | 95 | — | — | Y$_2$O$_3$ | 5.0 | 12 | 10 | 0.05 | 50 | 0.20 |
| 4 SiC | — | — | — | Y$_2$O$_3$ Al$_2$O$_3$ | 1.0, 2.0 | 10 | 10 | 0.05 | 23 | 0.50 |
| 5 alumina | 90.97 | TiC | 9.0 | ZrO$_2$ | 0.03 | 4.2 | 3.2 | 0.03 | 10.0 | 0.18 |
| 6 | 85.0 | | 9.0 | ZrO$_2$ | 6.0 | 4.2 | 3.2 | 0.057 | 9.0 | 0.16 |
| 7 | 32.0 | | 60.0 | ZrO$_2$ | 8.0 | 4.5 | 3.5 | 0.057 | 5.0 | 0.15 |
| 8 | 82.0 | | 10.0 | ZrO$_2$ | 8.0 | 4.1 | 3.4 | 0.057 | 1.5 | 0.14 |
| 9 | 62.0 | | 30.0 | ZrO$_2$ | 5.0 | 4.2 | 3.3 | 0.057 | 1.2 | 0.10 |
| 10 | 42.0 | | 50.0 | ZrO$_2$ | 8.0 | 4.4 | 3.4 | 0.057 | 1.4 | 0.12 |
| 11 | 82.0 | | 10.0 | ZrO$_2$ | 6.0 | 3.6 | 1.5 | 0.057 | 0.9 | 0.06 |
| 12 | 62.0 | | 30.0 | ZrO$_2$ | 8.0 | 5.6 | 1.8 | 0.057 | 0.7 | 0.04 |
| 13 | 42.0 | | 50.0 | ZrO$_2$ | 8.0 | 4.0 | 2.0 | 0.057 | 0.5 | 0.05 |
| 14 | 69.95 | | 30.0 | ZrO$_2$ | 0.05 | 3.7 | 1.6 | 0.03 | 0.4 | 0.02 |
| 15 | 65.0 | | 30.0 | ZrO$_2$ | 5.0 | 2.0 | 1.4 | 0.04 | 0.2 | 0.01 |
| 16 | 43.0 | | 50.0 | ZrO$_2$ | 7.0 | 1.8 | 1.3 | 0.05 | 0.3 | 0.02 |
| 17 | 65.0 | | 30.0 | NiO | 0.005 | 1.8 | 1.3 | 0.35 | 0.5 | 0.03 |
| 18 | 62.5 | | 30.0 | NiO | 0.008 | 1.9 | 1.4 | 0.56 | 0.7 | 0.03 |
| 19 | 65.0 | | 30.0 | CoO | 0.005 | 1.8 | 1.3 | 0.35 | 0.5 | 0.03 |
| 20 | 62.0 | | 30.0 | CoO | 0.008 | 1.9 | 1.5 | 0.57 | 0.5 | 0.03 |
| 21 | 90.97 | | 9.0 | Y$_2$O$_3$ | 0.03 | 4.2 | 3.2 | 0.03 | 10.2 | 0.19 |
| 22 | 89.0 | | 3.0 | Y$_2$O$_3$ | 8.0 | 4.7 | 3.2 | 0.057 | 8.6 | 0.16 |
| 23 | 32.0 | | 60.0 | Y$_2$O$_3$ | 8.0 | 4.5 | 3.5 | 0.057 | 8.1 | 0.16 |
| 24 | 82.0 | | 10.0 | Y$_2$O$_3$ | 8.0 | 4.1 | 3.4 | 0.057 | 1.6 | 1.30 |
| 25 | 62.0 | | 30.0 | Y$_2$O$_3$ | 8.0 | 4.2 | 3.3 | 0.057 | 1.3 | 0.11 |
| 26 | 42.0 | | 50.0 | Y$_2$O$_3$ | 8.0 | 4.4 | 3.4 | 0.057 | 1.4 | 0.12 |
| 27 | 82.0 | | 10.0 | Y$_2$O$_3$ | 8.0 | 3.6 | 1.5 | 0.057 | 0.6 | 0.06 |
| 28 | 62.0 | | 30.0 | Y$_2$O$_3$ | 8.0 | 3.6 | 1.8 | 0.057 | 0.6 | 0.05 |
| 29 | 42.0 | | 50.0 | Y$_2$O$_3$ | 8.0 | 4.0 | 2.0 | 0.057 | 0.7 | 0.05 |
| 30 | 59.95 | | 30.0 | Y$_2$O$_3$ | 0.05 | 3.7 | 1.8 | 0.03 | 0.3 | 0.02 |
| 31 | 65.0 | | 30.0 | Y$_2$O$_3$ | 5.0 | 2.0 | 1.4 | 0.04 | 0.2 | 0.02 |
| 32 | 43.0 | | 50.0 | Y$_2$O$_3$ | 7.0 | 1.6 | 1.3 | 0.05 | 0.2 | 0.01 |

B in this table indicating magnetic flux density.

As a result, in order to increase the life time of the ultrasonic motor and inhibit the opposing member from being worn out, it is preferable to employ the structure formed of an alumina based sinter containing titanium carbide as a secondary component.

In these samples Nos. 5 to 32, a titanium oxide film was formed on the contact face of the friction member in each of the samples, and it is confirmed that the friction force of the friction member to the drive transmitting member is increased with this titanium oxide layer.

Further, paying attention to the structures is formed of alumina based sinters containing titanium carbide as the secondary component, it is found that samples Nos. 8 to 10 and samples Nos. 24 to 26 in which the titanium carbide content in the alumina based sinter is set between 10 and 50% by weight can further restrict the abrasion amount of the friction member arid drive transmitting member in comparison with samples Nos. 5 to 7 and the samples Nos. 21 to 23 in which the content of the titanium carbide is more than the range mentioned above.

Further, it is seen that samples Nos. 11 to 13 and samples Nos. 27 to 29, which have respective maximum grain sizes of the alumina phase and titanium carbide phase in the sinter than 4 $\mu$m or less and the maximum pore size of the alumina based sinter 2 $\mu$m or less, can make the abrasion amounts of both friction member and drive transmitting member smaller in comparison with samples Nos. 8 to 10 and Nos. 24 to 26 having the other range.

As a result, it is found that in order to further restrict the abrasion amounts of the abrasion member and the drive transmitting member, the content of the titanium carbide in the alumina based sinter may preferably be set between 10 and 50% by weight, the respective maximum grain sizes of the alumina and the titanium carbide phases in the alumina based sinter preferably being set to be equal to or less than 4 $\mu$m, and the maximum pore size of the alumina based sinter preferably being set to be equal to or less than 2 $\mu$m.

Further, in samples Nos. 6 to 13, 18, 20 and 22 to 29 in which the contents of the aids of paramagnetic metal oxides are more than 7% by weight, the maximum magnetic flux density of the friction member is more than 0.05 $\mu$T.

As a result, it is found that the content of the aid component of the paramagnetic metal oxide may preferably be made 7% or less by weight.

Embodiment 2

A guide apparatus using an ultrasonic motor as a driving source is structured, as shown in FIG. 1, such that to one side surface of a stage 13a a linear scale 16a is fixed in parallel to a guide member 12, the ultrasonic motor 15 is fixed to a position opposing to the drive transmitting member 14 on the base substrate 11, and the friction member 15a of the ultrasonic motor 15 is brought into contact with a driving surface 54a of the drive transmitting member 14 vertically.

The drive transmitting member 14 is provided in another side surface of the stage 13 in parallel to the guide member 12, and a measuring head 56b is provided at a position opposing to the linear scale 16a on the base substrate 11 in a lateral side of the guide apparatus, whereby a position detecting means 16 is constituted. In accordance with another aspect of the position detecting means 16, it is possible to utilize a system in which a reflection mirror is provided on the stage 13 and the position is detected by a laser length measuring meter fixed onto the base substrate 11.

Further, the position information such as a displacement, a velocity, an acceleration and the like output from the position detecting means 16 in accordance with the movement of the stage 13 is sent to the driving control portion 10, the driving control portion 10 executes a PID arithmetic process on the basis of deviation between a reference position information (displacement, velocity and acceleration) based on the preset moving profile of the stage 13 and the position information, and executes a feedback control for outputting the output value of the PID arithmetic process to the ultrasonic motor 15 as the driving command signal. The ultrasonic motor 15 makes an elliptical motion in accordance with the driving command signal, and makes the stage 13 move along the guide member 12 on the basis of the friction driving with the friction member 15a provided in the ultrasonic motor 15 so as to position. The moving profile of the stage 13 mentioned above shows a batch information determined on the basis of the time, the displacement, the acceleration and the like up to the target moving position of the stage 13.

The guide apparatus in accordance with the embodiment 2 includes a monitoring portion 1 for monitoring each of a slip distance of the friction member 15a in the ultrasonic motor 15, the tangential force applied to the driving surface 14a of the drive transmitting member 14 on the basis of the friction driving with the ultrasonic motor 15 and the friction work determined by the product of the slip distance and the tangential force.

The monitoring portion 1 includes a slip distance measuring portion 2, and calculates the slip distance of the friction member 15a in the ultrasonic motor 15 with respect to the drive transmitting member 14 of the stage on the basis of the position information output from the non-contact type measuring, means 5 and the position information output from the position detecting means 16.

The monitoring portion 1 includes a tangential force measuring portion 3, and calculates a tangential force applied to the driving surface 54a of the drive transmitting member 14 due to the friction driving with the ultrasonic motor 15 on the basis of an acceleration calculated from a weight (a total weight including the stage 13 and a subject mounted on the stage) of a transfer subject driven by the ultrasonic motor 15 and the position information obtained from the position detecting means 16.

In accordance with the present invention, the guide apparatus mentioned above includes the non-contact type measuring means 5 for measuring the position information such as the displacement, the velocity, the acceleration and the like of the friction member 15a during the driving of the ultrasonic motor 15. The non-contact type measuring means 5 can use a laser Doppler vibration meter.

The monitoring portion 1 includes a friction work measuring portion 4, and calculates a product of the slip distance calculated in the slip distance measuring portion 2 and the tangential force calculated in the tangential force measuring portion 3.

The slip distance measuring portion 2 calculates the slip distance in accordance with Equation 1 by comparing the vibration velocity of the friction member 15a at a time of driving the ultrasonic motor 15 with the moving velocity of the stage 13.

$$Ls=(A-B) \times Tc \qquad 1$$

where, Ls: slip distance of friction member in ultrasonic motor, A: vibration velocity of friction member in ultrasonic motor, B: moving velocity of stage obtained by position detecting means, and Tc: contact time of friction member in ultrasonic motor.

The slip distance Ls is calculated every servo loop time at the feedback control time. For example, in the case that the servo loop time is longer than the driving frequency of the ultrasonic motor 15, and plural times of elliptical cycles are generated between the servo loops, the vibration velocity A between the servo loops can be calculated in an averaging manner. Further, the contact time Tc of the friction member 15 in the ultrasonic motor 15 can be defined as a time corresponding to an area in which the vibration velocity A becomes slow down during one cycle of vibration on the basis of a waveform of the vibration velocity A of the friction member 15a obtained from the non-contact type measuring means 5. At the contact time Tc, it is possible to calculate every servo loop time. Further, in the case that plural times of elliptical cycles are generated between the servo loops, the contact times Tc between the servo loops are averaged.

The contact force can be calculated in accordance with Equation 2 on the basis of the acceleration between the servo loops calculated from the positions information of the stage 13 obtained from the position detecting means 16, and the weight of the transferred material driven by the ultrasonic motor 15.

$$F=G \times W \qquad 2$$

where, F: tangential force applied to driving surface of drive transmitting member by a friction driving with ultrasonic motor, G: acceleration calculated from position information obtained from position detecting means, and W: weight of transferred subject driven by ultrasonic motor.

The present invention is going to monitor the tangential force applied to the driving surface 54a of the drive transmitting member 14 on the basis of the friction driving with the ultrasonic motor 15 because the tangential force always changes in accordance with the driving velocity, the acceleration and the pressing force of the ultrasonic motor 15 and the weight of the transferred subject even when the slip distance Ls is constant, and the abrasion amount of the friction member and the drive transmitting member is also increased due to this increase of tangential force.

That is, in the case of using the ultrasonic motor 15 as the driving source, it is necessary to best comprehend the abrasion state of the friction member 15a in the ultrasonic motor 15 and the drive transmitting member 14 in the stage 13, however, in order to achieve the necessity, it is important to monitor a tangential force F applied to the driving surface 54a of the drive transmitting member 14 in accordance with the friction driving with the friction member of the ultrasonic motor 15 changing on the basis of the weight of the transferred subject and the vibration velocity, the acceleration, the pressing force and the like of the ultrasonic motor 15, in addition to the slip distance Ls of the friction member 15a in the ultrasonic motor 15.

As described above, in accordance with the guide apparatus of the present invention, since the monitoring portion 1 monitors both of the slip distance Ls and the tangential force F which have relevance to the abrasion, it is possible to previously prevent the position accuracy of the stage 13 from being reduced during the driving and prevent the abrasion member 15a of the ultrasonic motor 15 and the drive transmitting member 14 of the stage 13 from being abnormally worn out, at a time when the increase of the slip distance Ls or the reduction of the tangential force F is generated (these changes mean that the change appears in the contact state between the ultrasonic motor 15 and the stage 13). Accordingly, it is possible to more accurately comprehend the degree of the abrasion in comparison with the structure in which only the slip distance Ls is monitored.

The slip distance measuring portion 2 of the monitoring portion 1 may determine the transmission efficiency together with the slip distance Ls or independently, so as to comprehend the degree of the slip. The transmission efficiency can be determined by the following formula 3 as the applicant has already disclosed in Japanese Unexamined Patent Publication No. 2000-308939.

$$H = B/A \qquad 3$$

where, H: transmission efficiency, A: vibration velocity obtained front non-contact type measuring means, B: position information from position detecting means.

Further, the guide apparatus in accordance with the present invention can include a friction work measuring portion 4 for calculating the product of the slip distance Ls calculated by the slip distance measuring portion 2 and the tangential force F calculated by the tangential force measuring portion 3, in the monitoring portion 1.

It is previously shown that it is important that the abrasion in the driving portion is monitored by both of the slip distance Ls and the tangential force F indicating a severity of contact, however, monitoring on the basis of the product of the slip distance Ls and the tangential force F, that is, an amount to be called as the friction work can monitor the abrasion state comprehensively as a quantitative value.

That is, with respect to the abrasion amount which becomes a largest problem in the case of using the ultrasonic motor 15 as the driving source, it is found that a relation formula shown in Equation 4 is obtained between the product of the slip distance Ls and the tangential force F and the abrasion amount.

$$V = k \cdot Ls \cdot F \qquad 4$$

where, V: total abrasion amount, per unit distance, of both friction member of an ultrasonic motor and drive transmitting member of a stage, Ls: slip distance of friction member in ultrasonic motor, F: tangential force applied to driving surface of drive transmitting member due to friction drive with ultrasonic motor, k: constant per unit friction work.

In this case, the constant k is determined by a combination of materials forming the friction member 15a of the ultrasonic motor 15 and the drive transmitting member 14 of the stage 13, if the driving condition is previously set. For example, in the case that the materials forming the friction member 15a of the ultrasonic motor 15 and the drive transmitting member 14 of the stage 13 are both alumina ceramics, the constant k is about $3.5 \times 10^{-5}$ mm³/Nm (per unit friction work), and the abrasion amount V (mm³) can be calculated in accordance with the formula of $3.5 \times 10^{-6} \times Ls$ (m)$\times F$(N) on the basis of the slip distance Ls (m) and the tangential force F (N).

Therefore, in accordance with the guide apparatus of the present invention, the friction work measuring portion 4 of the monitoring portion 1 includes calculating the friction work so as to determine the abrasion amount per unit distance and multiplying this by the driving distance of the stage so as to calculate the abrasion amount with respect to the total distance. It is possible to quantitatively forecast the degree of abrasion and comprehend the life time of the guide apparatus on the basis of the total distance abrasion amount.

Further, when the structure is made such that the friction work is always monitored by the friction work measuring portion 4 and the guide apparatus is automatically stopped at a time when the abrasion amount becomes a previously calculated abrasion amount, it is possible to previously prevent the position accuracy of the stage 13 from being deteriorated during the driving and it is possible to previously prevent the friction member 15a of the ultrasonic motor 15 and the drive transmitting member 14 of the stage 13 from being abnormally worn out, and it is possible to omit the inspection which is unnecessary during the operation, so that it is possible to improve the working efficiency of the guide apparatus.

EXAMPLE 2

A description will be given of a particular example of the guide apparatus in accordance with the present invention shown in FIG. 1. The guide member 12 guiding the stage 13 employs a cross roller guide having a stroke of 200 mm, and the stage 13 is formed as a plate-like body having dimensions 250 mm×120 mm×30 mm, and is formed by the alumina. Further, a dead weight (not shown) is mounted on the stage 13, whereby a weight of the transferred subject (the stage 13 and the dead weight) becomes 100 N.

Further, the ultrasonic motor 15 for driving the stage 13 is provided with the friction member 15a made of alumina ceramics on an end surface of a piezoelectric driving portion 15e having a width 8 mm, a length 30 mm and a thickness 3 mm, and the piezoelectric driving portion 15e is the same as the conventional one shown in FIGS. 10A and 10B, the contact face of the friction member 15a is formed in a spherical shape in which a curvature radius is 3 mm, and a surface roughness is set to 0.05 μm in a center line average roughness (Ra).

Further, the linear scale 16a is used for the position detecting means 16 of the stage 13 and is placed in one side surface of the stage 13, and a detection head 56b is placed at an opposing position to the linear scale 16a, thereby constructing the position detecting means 16. Further, a drive transmitting member 14 made of alumina ceramics is placed on another side surface of the stage 13.

Further, the driving control portion 10 and the monitoring portion 1 are connected, a laser Doppler vibration meter is used for the non-contact type measuring means 5, the laser Doppler vibration meter is placed vertically with respect to the friction member 15a of the ultrasonic motor 15, and the structure is made such that the slip distance Ls is calculated in accordance with Equation 1 by the slip distance measuring portion 2 of the monitoring portion 1 on the basis of the position information (the displacement, the velocity and the acceleration) at a time of driving the ultrasonic motor 15, and the position information (the displacement, the velocity and the acceleration) output from the position detecting means 16.

Further, the acceleration is calculated on the basis of the position information at a time of driving between the servo loops, by the tangential force measuring portion 3 of the monitoring portion 1, and the tangential force F is calculated in accordance with Equation 2.

Further, the PID control is used for controlling the driving of the ultrasonic motor 15, two kinds of controls comprising a trapezoidal control in which the moving distance of the stage 13 is 200 mm, the acceleration is 0.1 G and the maximum velocity is 50 mm/s, and a trapezoidal control in which the moving distance of the stage 13 is 200 mm, the acceleration is 0.1 G and the maximum velocity is 100 mm/s are prepared as the moving profile of the stage 13 and are previously set in the driving control portion 10, and thereafter the PID control is executed so that the position deviation allowable value is within 1 μm on the basis of the moving profile.

Further, there is executed an experiment of measuring the slip distance Ls and the abrasion rate of the friction member 15a in the ultrasonic motor 15 after driving the ultrasonic motor 15 by a frequency of 40 kHz, taking a preload and velocity at that time as a standard, and driving the stage 13 for 100 km.

The servo loop time is set to 0.3 ms, and the slip distance Ls is set to an average value within the servo loop time of the driving command signal. Further, the abrasion rate is set to a value obtained by dividing the abrasion volume of the abrasion member 15a of the ultrasonic motor 15 and the drive transmitting member 14 of the stage after driving by the driving distance. Further, the same experiment is executed also in the case that the D term among the control parameters (the P term, the I term and the D term) is made high. The result is as shown in FIG. 3.

Figure 3:
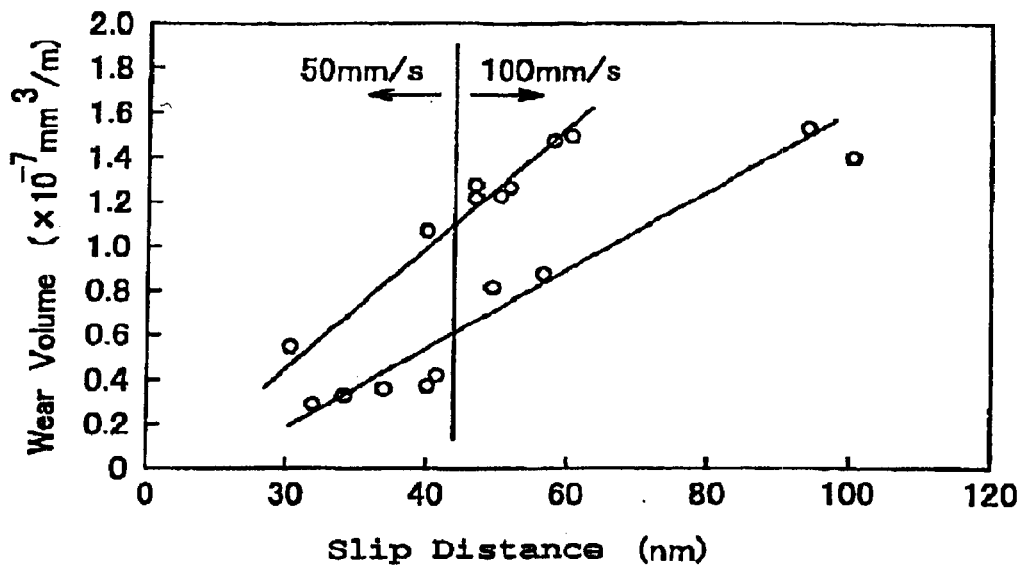
FIG. 3 is a graph showing a relation between a slip distance and an abrasion rate at a time of driving a stage by using the guide apparatus in accordance with the present invention.

It is known from FIG. 3 that the slip distance Ls becomes large in accordance with the increase of the velocity, and that the abrasion amount expressed by the abrasion volume is increased in proportion to the increase of the slip distance Ls.

Under the same condition within the position allowable deviation 1 μm, the slip distance Ls is significantly different in accordance with the driving velocity and the PID setting, in particular, the high PID setting makes the abrasion large. Ascending the D term applies an excessive PID although the low PID is inherently sufficient; accordingly, the slip of the ultrasonic motor 15 is considered to be generated, resulting in the stage 13 to be made unstable. A dispersion of the slip distance Ls within a uniform velocity driving is caused by a dispersion of the set value in the D term.

Further, it is known from FIG. 3 that the abrasion amount is different by changing the preload even in the same slip distance Ls. Seeing the difference in the tangential force corresponding to the preload change, the tangential force is increased in accordance with the increase of the preload, and since the driving is performed by applying a surplus preload in spite that the driving force is sufficient, the contact face pressure becomes high and the abrasion is promoted.

As a result, it is known that driving with making the slip force Ls and the tangential force F small causes the reduction of abrasion.

Further, it is possible to accurately judge the abrasion degree by monitoring both of the slip distance Ls and the tangential force F applied to the driving surface 54a of the drive transmitting member 14 due to the friction driving with the ultrasonic motor 15.

As mentioned above, it is possible to comprehend the slip distance Ls of the ultrasonic motor 15 by providing the slip distance measuring portion 2 for relatively comparing the position information output from the non-contact type measuring means 5 with the position information output from the position detecting means 16 so as to arithmetically process as well as providing the non-contact type measuring means 5 for measuring the position information of the friction member 15a during the driving of the ultrasonic motor 15, and it is possible to comprehend the abrasion state of the friction member 15a of the ultrasonic motor 15 and the driving surface 54a of the drive transmitting member 14 during the driving of the stage 13 by providing the tangential force measuring portion 3 for calculating the tangential force applied to the driving surface 54a of the drive transmitting member 14 on the basis of the acceleration obtained from the weight of the transferred subject and the position information output from the position detecting means 16 in the monitoring portion 1.

Figure 4:
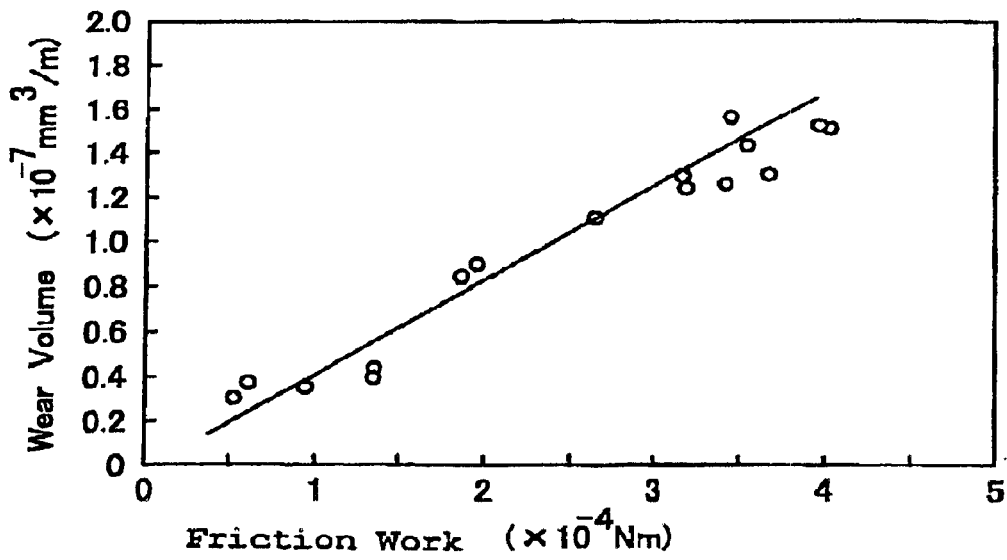
FIG. 4 is a graph showing a relation between a friction working load and an abrasion rate during driving the stage by using the guide apparatus in accordance with the present invention shown in FIG. 1.

Further, it is known from FIG. 4 that a proportional relation exists between the friction work obtained by the product of the slip distance Ls and the tangential force F in FIG. 3 and the abrasion amount.

Accordingly, it is known that it is possible to forecast the abrasion amount by monitoring the abrasion work load by the abrasion work load measuring portion 4 in the monitoring portion 1, and it is possible to judge the life time of the guide apparatus.

Embodiment 3

Figure 2:
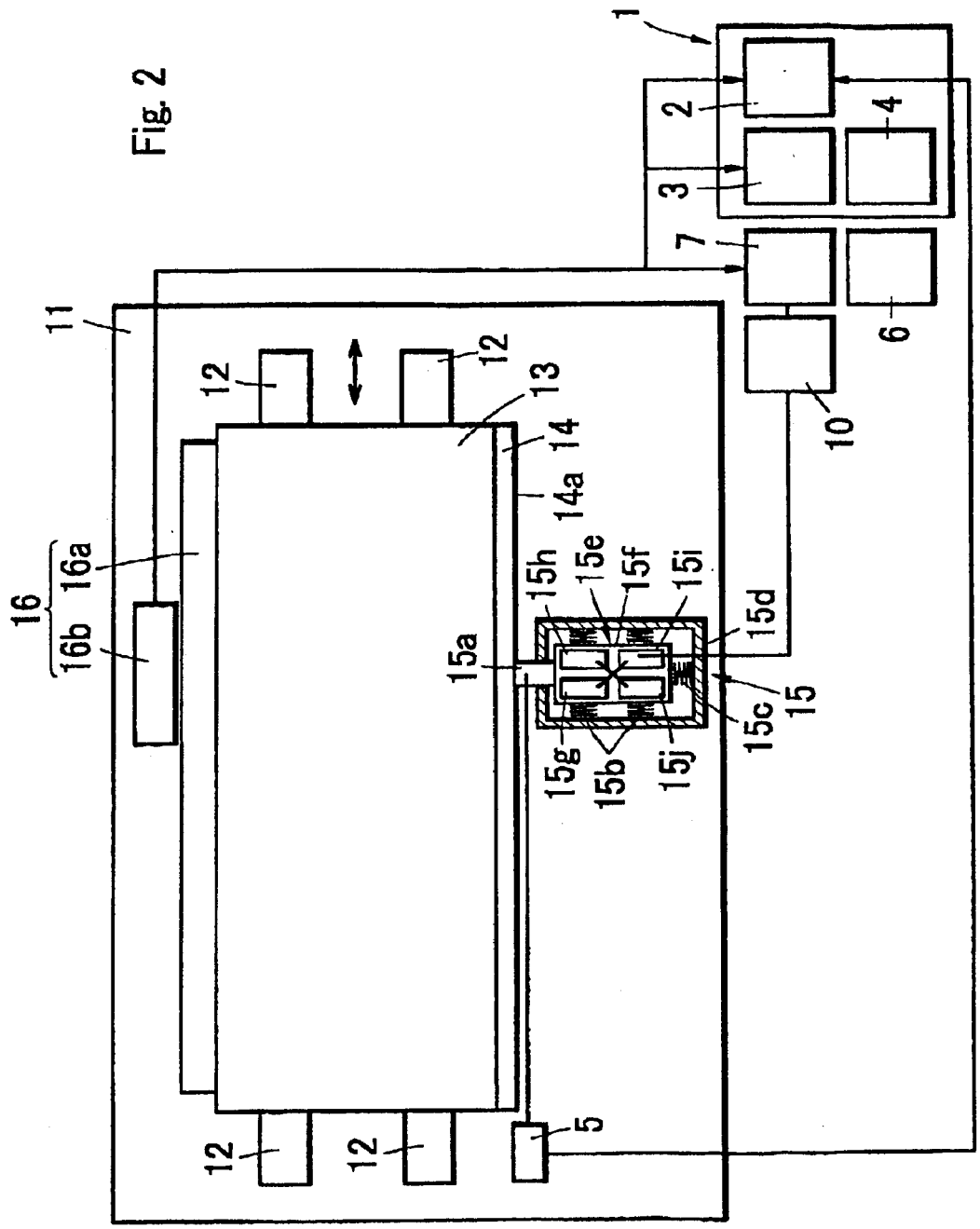
FIG. 2 is a schematic top view of a guide apparatus in accordance with another embodiment of the present invention.

Successively, the example 2, the guide apparatus in accordance with the present invention can further include a decision portion. The decision portion judges as shown in FIG. 2 whether or not the friction work calculated by the friction work measuring portion 4 in the monitoring portion 1 is within the threshold value of the preset friction work. The threshold value of the friction work is set by taking the life time of the friction member into consideration. This value is determined on the basis of the material of the friction member, the load applied to the stage and the other elements. The shorter the life time of the friction member is, the smaller the range is, and the longer the life time is, the larger the range is.

The guide apparatus in accordance with the present invention can include the parameter adjusting portion 7. The parameter adjusting portion 7 further changes the control parameter of the driving control portion 10 so that the result of the decision portion 6 always becomes the threshold value of the friction work, as shown in FIG. 2.

The guide apparatus in accordance with the present invention can further include the alarm portion 8. The alarm portion 8 alarms that the apparatus is abnormal in the case that the abrasion of the friction member is promoted, and the range of the parameter adjustable by the parameter adjusting portion 7 becomes narrow and becomes more than a preset threshold value of the friction work.

When the stage 13 is driven in a state in which the deviation between the set position and the actual position is fixed, the smaller value of the friction work indicated by the friction work measuring portion 4 shows the smaller slip of the ultrasonic motor 15, and this means that the motor efficiently transmits the driving force to the stage 13 and further restricts the abrasion amount to a minimum limit.

Accordingly, when the threshold value of the friction work is set in the decision portion and the friction work calculated in the friction work measuring portion 4 becomes more than the threshold value of the set friction work, it is possible to easily confirm that there is a risk that the abnormal abrasion is generated in the friction member 15a of the ultrasonic motor 15 and the drive transmitting member 14 of the stage 13.

The threshold value of the friction work in the decision portion 6 comprehends the minimum value of the friction work on the basis of the relation between the abrasion work load and the abrasion amount obtained by Equation 4, and suitably determines the threshold value of the friction work on the basis of the minimum value.

The guide apparatus in accordance with the present invention can be provided with a parameter adjusting portion 7 which changes the control parameters (the P term, the I term and the D term in the PID control) of the driving control portion 10 so that the friction work calculated by the friction work measuring portion 4 does not become more than the threshold value of the preset friction work, as shown in FIG.

2, as well as the decision portion 6 which monitors the abrasion state in the friction member 15a of the ultrasonic motor 15 and the drive transmitting member 14 of the stage 13. The adjustment of the control parameter can previously prevent the ultrasonic motor 15 from being abnormally abraded, and can inhibit the abrasion from being generated, and further can achieve the stable driving of the stage 13 for a long time period.

Further, it is preferable that the guide apparatus includes the alarm portion. When the friction work in the decision portion 6 does not satisfy the threshold value even by adjusting the control parameters in the parameter adjusting portion 7, the alarm portion gives a warning. When the operation of the apparatus suddenly stops after the friction work becomes more than the threshold value, not only the products under being manufactured become defect, but also the manufacturing line completely stops. Accordingly, there is a risk of suffering a lot of loss. The alarm portion informs a maintenance operator of the abnormality of the apparatus in advance by various kinds of means.

The alarm portion can employ a connecting means for connecting the decision portion 6 to an apparatus for directly informing of the abnormality such as a warning sound, a warning lamp or the like. The alarm portion may be a means for connecting the decision portion 6 to a power source apparatus of a manufacturing line, or may be a means for indirectly connecting the decision portion 6 to a user of the guide apparatus in accordance with the present invention. In the case that the friction work becomes more than the threshold value during the operation, the alarm portion is operated, and quickly informs of the abnormality of the apparatus so as to make it possible to inspect, repair and replace.

In accordance with a preferable embodiment of the present invention, the decision portion 6 judges whether or not the friction work is within the threshold value, the parameter adjusting portion 7 adjusts the control parameter of the driving control portion 10 so that the result of the decision portion 6 becomes within the preset threshold value of the friction work, and the alarm portion 8 gives a warning of the abnormality of the apparatus in the case that the abrasion of the friction member becomes more than the preset threshold value of the friction work and requires the inspection of the guide apparatus. This embodiment can previously prevent the ultrasonic motor 15 from being abnormally worn out, can restrict the abrasion and can achieve the stable driving of the stage 13 for a long time period.

The apparatus in accordance with this embodiment can be preferably used in the precision working machine, the precision measuring apparatus, and the drawing exposure apparatus in the semiconductor manufacturing process in which a high position accuracy is required in the stage 13 under operation.

The vibration type of the ultrasonic motor 15 used in the guide apparatus in accordance with the present invention as mentioned above is not particularly limited, and there can be employed not only a single vibration mode, but also plural vibration modes such as a mode conversion type, a multiplex mode type, a mode rotary type, a compound vibration type or the like.

Further, in the guide apparatus in accordance with the present invention, the description is given of the example in which the movable body constituting the stage 13 linearly moves, however, the present invention can be applied to the guide apparatus in which the movable body rotates, and can be applied to various modifications and changes within the scope of the present invention.

EXAMPLE 3

Next, there are prepared a guide apparatus shown in FIG. 2 in which the decision portion 6 and the parameter adjusting portion 7 are provided in the guide apparatus in accordance with the example 2, and a guide apparatus having neither decision portion 6 and nor parameter adjusting portion 7. The moving profile is made the same as the example 2 except the maximum velocity of the stage 13 being set to 100 mm/s. The test is performed for searching the slip distance Ls, the friction work and the abrasion amount monitored by the monitoring portion 1 at a time of driving the stage 13 for 1000 km. The results are shown in Table 2.

TABLE 2

| Stage | embodiments | | Comparative examples | |
|---|---|---|---|---|
| driving distance (km) | Slip distance (nm) | Friction work (× $10^{-4}$ Nm) | Slip distance (nm) | Friction work (× $10^{-4}$ Nm) |
| 50 | 50 | 1.4 | 50 | 1.5 |
| 100 | 50 | 1.5 | 80 | 2.0 |
| 500 | 50 | 1.5 | 120 | 3.3 |
| 1000 | 50 | 1.4 | 150 | 3.8 |

In the guide apparatus shown in FIG. 1 which has neither decision portion 6 nor the parameter adjusting portion 7, when the driving distance of the stage 13 reaches 500 km, the slip distance Ls of the friction member 15a in the ultrasonic motor 15 is increased to 120 nm, and the friction work is increased to $3.3 \times 10^{-4}$ Nm.

On the contrary, in the guide apparatus shown in FIG. 2 which has both of the decision portion 6 and the parameter adjusting portion 7, even when driving the stage 13 for 1000 km, the slip distance Ls of the friction member 15a in the ultrasonic motor 15 is 50 nm, and the friction work is stably $1.4 \times 10^{-4}$ Nm, and as a result of measuring the abrasion amount after driving, the abrasion amount is equal to or less than ⅕ the abrasion amount of the guide apparatus shown in FIG. 1.

As a result, the guide apparatus shown in FIG. 2 which is provided with the monitoring portion 1, the decision portion 6 and the parameter adjusting portion 7 can restrict the abrasion of the friction member 15a of the ultrasonic motor 15 and the drive transmitting member 14 of the stage 13, and can widely improve the life time of the guide apparatus.

Further, in the case of always measuring the friction work corresponding to the product of the slip distance Ls and the tangential force F, measuring the friction work every 10 km and multiplying the friction work by the abrasion constant so as to calculate the abrasion amount, roughly estimating the total of the abrasion amounts during driving for 1000 km as an estimated value of the abrasion amount from the calculated value, and comparing the estimated value with the actual abrasion amount obtained by the experiment, a difference between the estimated value and the actual measured value is less than 5%, that is, the values are approximately coincident.

Further, the guide apparatus mentioned above is provided with the alarm portion 8 which gives the warning sound in the case that the decision portion 6 judges the friction work becomes more than the threshold value, automatically stops the manufacturing line, and informs the user of the guide apparatus of the necessity of maintenance by on-line, and is introduced to the manufacturing line operating in parallel to the various kinds of manufacturing apparatus. In this case, even when the abnormality is generated in the guide apparatus, it is possible to automatically stop the manufacturing line and know a repairing timing of the apparatus. Accordingly, there are not generated problems such as a defect in product, a manufacturing line stop and the like.

Embodiment 4

Figure 5:
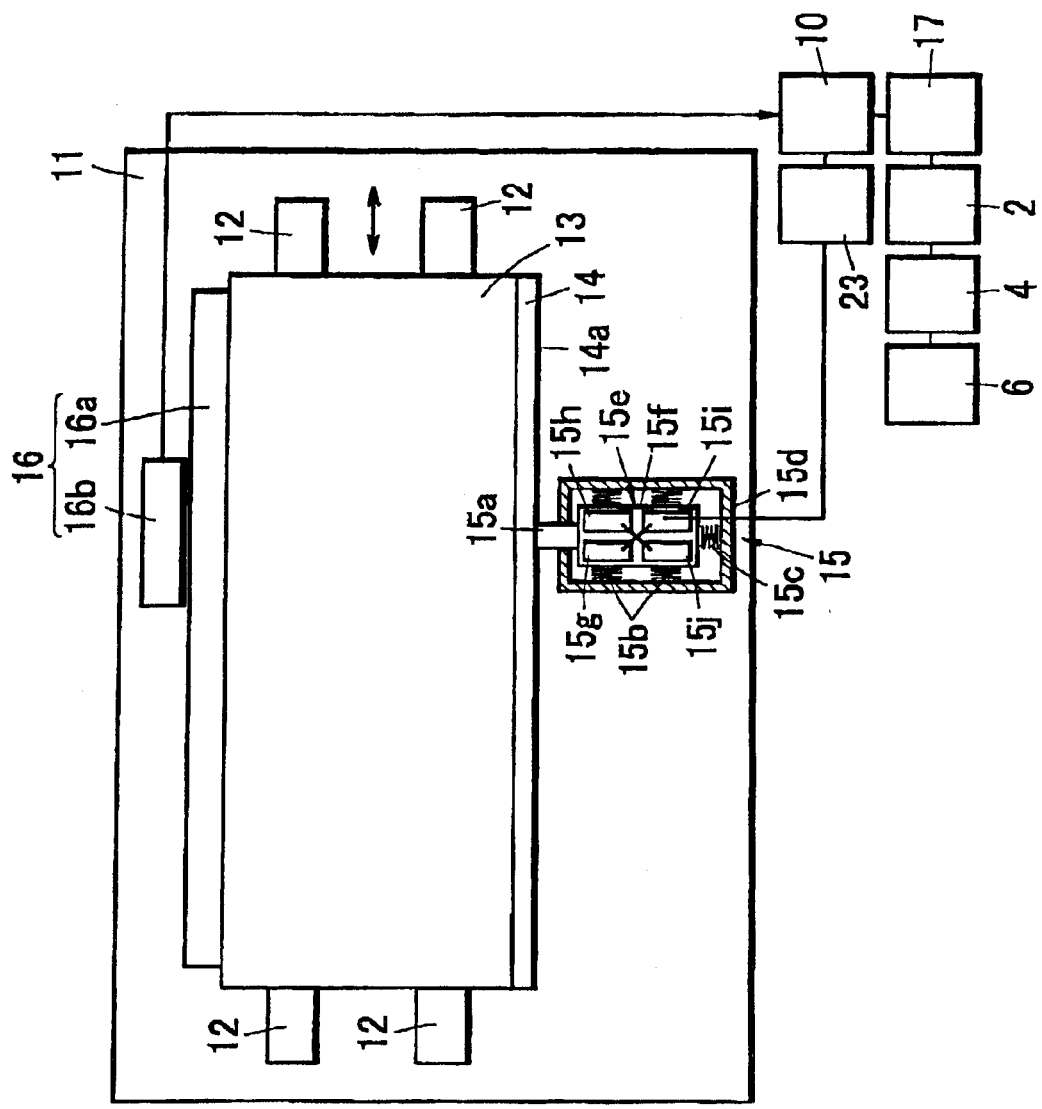
FIG. 5 is a schematic view of a guide apparatus in accordance with still another embodiment of the present invention.

A guide apparatus in accordance with this embodiment includes a replacing portion 17 for arithmetically processing a vibration velocity of the ultrasonic motor 15 on the basis of the driving command signal output from the driving control portion 10 by using a correlation between a preset driving command signal and vibration velocity for an open loop control, as exemplified in FIG. 5, with avoiding a direct measurement of the vibration velocity of friction member 15a in the ultrasonic motor.

This embodiment utilizes the matter that the driving command signal has a strong correlation with the vibration velocity of the friction member 15a in the ultrasonic motor 15 performing the friction transmission, and is structured such that the slip distance can be monitored on the basis of the driving command signal without using a non-contact type measuring means 77 during the driving, by replacing the vibration velocity of the friction member 15a by the driving command signal.

Since a relation between the vibration velocity of the friction member 15a and the driving command signal differs in accordance with the friction resistance of the guide member 12 in the guide apparatus, the weight of the stage 13 and the pressing force of the ultrasonic motor 15, the relation corresponds to a specific matter for the ultrasonic motor 15 and the stage 13 which are used in the apparatus.

Figure 6:
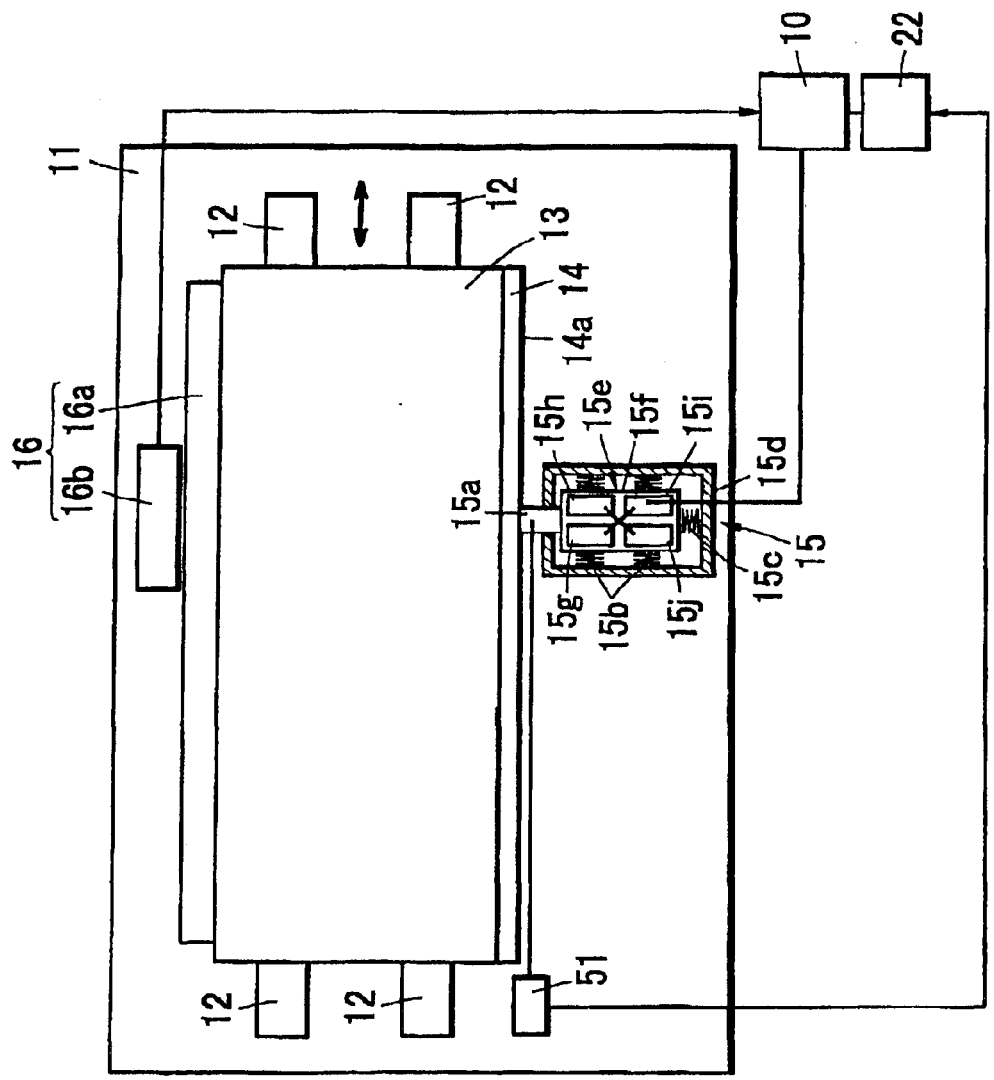
FIG. 6 is a view showing an arrangement of a guide apparatus used for previously determining a correlation between a driving command signal and a friction member, in the embodiment in accordance with the present invention shown in FIG. 5.

In order to execute the control, as shown in the apparatus in FIG. 6, it is necessary to previously determine a correlation between a specific driving command signal output from the driving control portion 10 by temporarily operating the non-contact measuring means 51 prior to starting the driving of the guide apparatus, and a vibration velocity obtained from the non-contact type measuring means 51, by means or a velocity measuring device 22, and this determined driving command signal-vibration velocity relation is utilized as a reference value.

Values of the vibration velocity and the driving command signal on the driving surface are picked up prior to starting the driving of the guide apparatus, the vibration velocity can be obtained only on the basis of the driving command signal by utilizing the correlation during the driving with reference to the reference value, and the transmission efficiency and the slip distance are calculated on the basis of the relational expression.

Figure 7:
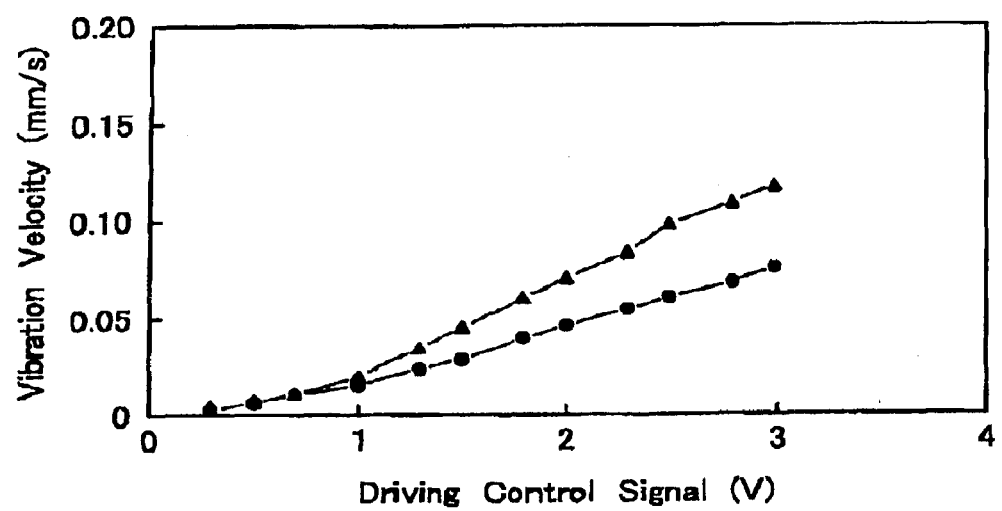
FIG. 7 is a graph showing a correlation between a predetermined driving command signal and the friction member, in the apparatus shown in FIG. 6.

The correlation between the vibration velocity and the driving command signal can be determined by applying the driving command signal in the respective levels so as to open drive, and measuring the vibration velocitys corresponding to the respective levels. When selecting the driving command signal in an optional number of levels, it is possible to obtain a correlation between the driving command signal and the vibration velocity as shown in FIG. 7. Further, as shown in FIG. 7, since the relation between the driving command signal and the vibration velocity differs in correspondence to the velocity aspects comprising an accelerating time (triangle mark), a constant velocity time and a decelerating time (black circle mark), it is important to differentiate the velocity range at the accelerating time from the velocity range at the constant velocity and decelerating time. That is, at the accelerating time, a higher driving command signal electric voltage than that of the constant velocity or decelerating time is required due to an influence of inertia force. Accordingly, in correspondence to the operation state whether the accelerating time or the decelerating time, the reference values of the driving command signal and the vibration velocity may be changed.

A section of the reference value in correspondence to the operation state depends upon various controls such as a trapezoidal control, an S-shaped control and the like, and differs in accordance with the velocity waveform. Accordingly, the correlation can be previously determined by using the non-contact type measuring means at the accelerating time and the constant velocity time. If a correlation curve at the accelerating time coincides with a correlation curve at the constant velocity time, the reference value is not particularly sectioned.

Further, after measuring the correlation between the driving signal and the vibration velocity mentioned above, the non-contact type measuring means 21 and the measuring device 22 are taken out from the apparatus, and the vibration velocity can be determined by setting the determined relation between the driving command signal and the vibration velocity as the reference value of the operation state during the driving and converting the driving command signal during being momently operated.

Further, in FIG. 5, the guide apparatus is provided with a slip distance measuring portion 2 which calculates the transmission efficiency to the drive transmitting member 14 or the slip distance between the driving surface 14a of the drive transmitting member 14 and the friction member 15a in comparison with the stage velocity, on the basis of the vibration velocity obtained in the replacing portion 17.

The slip distance measuring portion 2 calculates the slip distance Ls in accordance with Equation 1 on the basis of the vibration velocity of the friction member output from the replacing portion and the moving velocity output from the position detecting means. Further, the slip distance measuring portion 2 can calculate a transmission efficiency H in accordance with Equation 3 on the basis of the vibration velocity of the friction member output from the replacing portion and the position information output from the position detecting means.

It is possible to monitor the slip distance measured by the slip distance measuring portion 2 or the transmission efficiency in time sequence. Accordingly, the structure may be made such that a warning is given by seeing the slip distance or the transmission efficiency at this time. Therefore, it is possible to comprehend the life time early.

If the measurement of the reference value is finished prior to starting the driving, it is possible to replace by the vibration velocity by measuring only the driving command signal thereafter so as to comprehend the slip distance or the transmission efficiency. Accordingly, it is possible to take out the conventional non-contact measuring means 51 during the driving, and it is possible to make the apparatus compact.

As mentioned above, with respect to the slip distance Ls obtained by measuring only the driving command signal, as mentioned in the embodiment 2, it is possible to follow up the abrasion amount without placing the non-contact measuring means by calculating the tangential force F applied to the driving surface on the basis of the preset stage weight and the acceleration obtained by the position information output from the position detecting means, and calculating the friction work W corresponding to the product of the contact force F and the slip distance Ls measured by the replacing portion.

EXAMPLE 4

A guide apparatus is manufactured by respectively connecting the driving control portion 10, the replacing portion 11, the slip distance measuring portion 2 and the friction work measuring portion 4 as shown in FIG. 5 to the guide apparatus main body shown in the example 2, and the following tests are performed.

A laser Doppler vibration meter corresponding to the non-contact measuring means is placed vertically to the friction member 15a of the ultrasonic motor 15 in order to measure the reference value prior to starting the driving, the stage 13 is driven in accordance with an open loop drive, and the structure is made such as to replace the driving command signal by the vibration velocity on the basis of the result of the driving command signal at that time and the vibration velocity on the driving surface of the friction member measured by the laser Doppler vibration meter.

Further, the transmission efficiency and the slip distance are calculated by the slip distance measuring portion from the velocity of the movable body calculated on the basis of the position information obtained by the position detecting means and the vibration velocity mentioned above replaced in the replacing portion mentioned above.

Further, the structure is made such as to calculate tangential force applied to the driving surface in the side of the movable body 3 in accordance with the friction driving of the ultrasonic motor 15, and calculate the product of the tangential force and the slip distance obtained by the slip distance measuring portion 2 as the friction work values.

Further, after setting the driving control of the ultrasonic motor 15 to a trapezoidal control in which the moving distance of the stage 13 is 200 mm, the acceleration is 0.05 G and the maximum velocity is 100 mm/s, and previously setting the moving profile of the stage 13 in the control portion 10, the PID is determined so that the deviation is within 1 μm while monitoring the change rate between the servo loops, and is initially set. Furthers the ultrasonic motor 15 is driven at a frequency of 40 kHz, and the structure is made such as to be capable of monitoring the transmission efficiency and the slip distance calculated from the slip distance measuring portion 2 at that time and the result of the friction work measuring portion 4. Further, the transmission efficiency and the slip distance show average values of 20 servo loops respectively at the accelerating time, the constant velocity time and the decelerating time, and dispersions within the ranges.

In this case, since the reference values of the driving command signal and the vibration velocity in the case of replacing in the replacing portion 17 are the same between the constant velocity time and the decelerating time, they are not sectioned and unified. The results are as shown in Table 3.

TABLE 3

| | | In Accelerating | In decelerating |
|---|---|---|---|
| doppler vibration meter | Transmitting efficiency | 80 ± 5% | 95 ± 3% |
| | slip distance | 40 + 6 nm | 12 ± 2 nm |
| | Friction work | 120 ± 10 Nm | 85 Nm ± 8 Nm |
| calculating | Transmitting efficiency | 80 ± 8% | 92 ± 5% |
| | slip distance | 42 + 13 nm | 12 ± 5 nm |
| | Friction work | 125 ± 20 Nm | 84 ± 13 Nm |

As a result, it is found that the transmission efficiency and the slip distance which are calculated in the slip distance measuring portion 2 and the friction work which is calculated in the friction work measuring portion 4 has a little dispersion in comparison with the case of being calculated by using the value practically measured by the laser Doppler vibration meter, but are substantially consistent. The values obtained by replacing the driving command signal output from the driving control portion 10 by the vibration velocity on the driving surface of the friction member 15a indicate values corresponding to the practically measured values.

In this case, the dispersion in the transmission efficiency, the slip distance and the friction work is large because of using the average value between the servo loops, and in order to accurately measure, it is preferable to control in a state in which the servo loop is made short and drive under a condition that the number of amplitudes of the friction member is small between the servo loops.

As a result, it is possible to provide the guide apparatus which can quantitatively comprehend the slip state on the driving surface of the friction member 15a without using the non-contact measuring means 77 such as the laser Doppler vibration meter or the like during the driving.

What is claimed is:

1. An ultrasonic motor comprising:
    a vibration body; and a friction member fixed to the vibration body and transmitting a vibration of the vibration body to a side of a movable body,
    wherein the friction member is formed of an alumina based sinter containing alumina as main component and titanium carbide as a secondary component, and wherein a content of the titanium carbide is between 10 and 50% by weight in the alumina based sinter.

2. The ultrasonic motor according to claim 1, wherein maximum grain sizes of an alumina phase and titanium carbide phase in the alumina based sinter are 4 μm or less, and a maximum pore size in the alumina based sinter is 2 μm or less.

3. The ultrasonic motor according to claim 1, wherein the alumina based sinter contains paramagnetic metal oxide as an aid component in an amount of 0.05 to 7% by weight, and has 0.05 μT or less of a maximum magnetic flux density.

4. A guide apparatus comprising the ultrasonic motor having the friction member according to claim 1 and the movable member with which the friction member is brought into contact, wherein the ultrasonic motor frictionally drives the movable body by transmitting a vibration of the ultrasonic motor via the friction member as a driving source of the movable body.

5. A guide apparatus having an ultrasonic motor as a driving source of a movable body, comprising:
    the ultrasonic motor having a friction member;
    a movable body capable of being moved by a driving friction of the friction member;
    a position detecting means for measuring a position of the movable body; and
    a driving control portion arithmetically processing on the basis of a deviation between position information output from the position detecting means and reference position information based on a preset movement profile, and outputting a driving command signal for driving the ultrasonic motor so as to control the position of the movable body,
    wherein the guide apparatus comprises:
    a monitoring portion provided with a slip distance measuring portion for calculating a slip distance of the friction member of the ultrasonic motor; and
    a tangential force measuring portion for calculating a tangential force applied to a driven surface in a side of the movable body by a moving friction of the ultrasonic motor.

6. The guide apparatus according to claim 5, wherein the monitoring portion comprises a friction work measuring portion for measuring a product of the slip distance calculated by the slip distance measuring portion multiplied by the tangential force calculated by the tangential force measuring portion.

7. The guide apparatus according to claim 6, wherein the monitoring portion comprises a decision portion for judging whether or not a friction working load obtained by the friction working amount measuring portion is within a threshold value of the preset friction working amount.

8. The guide apparatus according to claim 7, further comprising a parameter adjusting portion which changes control parameters in the driving control portion on the basis of a result judged by the decision portion so that the friction working load obtained by the friction working load measuring portion becomes within a threshold value thereof.

9. The guide apparatus according to claim 5, wherein the slip distance measuring portion includes a non-contact type measuring means for measuring position information on the friction member including a displacement, a vibration velocity or a vibration acceleration of the friction member while the ultrasonic motor is driving the movable body.

10. The guide apparatus according to claim 5, wherein the slip distance measuring portion calculates the slip distance on the basis of a position information including a displacement, a vibration velocity, or a vibration acceleration of the friction member and position information output from the position detecting means during the driving of the ultrasonic motor in accordance with the following formula:

$$Ls = (A \cdot B) \times Tc$$

where, Ls is a slip distance of the friction member; A is a vibration velocity of a friction member in ultrasonic motor obtained from non-contact type measuring means; B is a moving velocity of a movable body obtained from position detecting means; and Tc is a contact time of the friction member.

11. The guide apparatus according to claim 8, which further comprises an alarm portion which notifies that an abnormality is generated within the apparatus in case that the friction working load is more than the preset threshold value while the guide apparatus being is driven by the driving control portion with using the control parameter changed by the parameter adjusting portion.

12. A guide apparatus having an ultrasonic motor as a driving source of a movable body, comprising:
   an ultrasonic motor having a friction member;
   a movable body capable of being moved on the basis of a driving friction with the ultrasonic motor;
   a position detecting means for measuring a position of the movable body; and
   a driving control portion processing a deviation between position information output from the position detecting means and reference position information based on a preset movement profile and outputting a driving command signal for driving the ultrasonic motor,
wherein the guide apparatus comprises:
   a replacing portion which replaces the driving command signal while the ultrasonic motor is driving the movable body by a vibration velocity of the friction member on the basis of a relationship of a specific driving command signal previously measured by moving the movable body by the ultrasonic motor with vibration velocity information on a driving face of the friction member; and
   a slip distance measuring portion which calculates a slip distance or a transmission efficiency on the basis of the velocity of the movable body calculated on the basis of the position information obtained from the position detecting means, and the vibration velocity substituted in the replacing portion.

13. The guide apparatus according to claim 12, which further comprises a friction work measuring portion for calculating a tangential force applied to a driven surface in a side of the movable body on the basis of the friction driving of the ultrasonic motor and calculating a friction work on the basis of a product of the tangential force and a slip distance obtained by the slip distance measuring portion.

14. The guide apparatus according to claim 13, further comprising a decision portion for judging whether or not the friction work obtained by the friction work measuring portion is within a preset threshold value.

15. The guide apparatus according to claim 14, further comprising a parameter adjusting portion for respectively changing the control parameters of the driving control portion on the basis of a result judged by the decision portion so that the friction work is within the preset threshold value.

16. The guide apparatus according to claim 15, which further comprises an alarm portion which notifies that an abnormality is generated within the apparatus in case that the friction working load is more than the preset threshold value while the guide apparatus being is driven by the driving control portion with using the control parameter changed by the parameter adjusting portion.

* * * * *